US008454202B2

(12) United States Patent
Markle et al.

(10) Patent No.: US 8,454,202 B2
(45) Date of Patent: Jun. 4, 2013

(54) DECORATIVE AND FUNCTIONAL LIGHT-EMITTING DEVICE LIGHTING FIXTURES

(75) Inventors: Joshua J. Markle, Raleigh, NC (US); Robert Higley, Cary, NC (US)

(73) Assignee: Cree, Inc., Durham, NC (US)

( * ) Notice: Subject to any disclaimer, the term of this patent is extended or adjusted under 35 U.S.C. 154(b) by 99 days.

(21) Appl. No.: 12/773,652

(22) Filed: May 4, 2010

(65) Prior Publication Data
US 2011/0242814 A1   Oct. 6, 2011

Related U.S. Application Data

(63) Continuation-in-part of application No. 12/751,477, filed on Mar. 31, 2010.

(51) Int. Cl.
*F21V 29/00*   (2006.01)

(52) U.S. Cl.
USPC .......................................... 362/294; 362/382

(58) Field of Classification Search
USPC .................................................. 362/294, 382
See application file for complete search history.

(56) References Cited

U.S. PATENT DOCUMENTS

| | | |
|---|---|---|
| D29,366 S | 9/1898 | MacIntire |
| D36,125 S | 10/1902 | Baron |
| D37,825 S | 2/1906 | Mygatt |
| D86,313 S | 2/1932 | Hollister |
| D132,865 S | 6/1942 | Drollinger |
| D158,209 S | 4/1950 | Lundquist |
| D211,121 S | 5/1968 | Moore |
| D212,776 S | 11/1968 | Renaud |
| 4,824,405 A | 4/1989 | Derain |
| D418,625 S | 1/2000 | Dolan |
| D496,124 S | 9/2004 | Parres |
| D563,021 S | 2/2008 | Hetfield et al. |
| D575,440 S | 8/2008 | Pelzl |

(Continued)

FOREIGN PATENT DOCUMENTS
WO   WO2008108574   *   9/2008

OTHER PUBLICATIONS

OA/Restriction Requirement for U.S. Appl. No. 29/364,639 dated Nov. 23, 2010.

(Continued)

*Primary Examiner* — Evan Dzierzynski
(74) *Attorney, Agent, or Firm* — Jenkins, Wilson, Taylor & Hunt, P.A.

(57) ABSTRACT

Lighting fixtures using light-emitting devices are disclosed with heat sinks that are both decorative and functional by providing heat dissipation for the light-emitting devices used therein. A luminaire can feature a base for attachment to a support and a driver positionable in the base. An electrical connector can extend downward from the base and have a proximal end and a distal end with the proximal end disposed in the base and engaging the driver. A heat sink can be disposed at the distal end of the electrical connector with the electrical connector extending through the heat sink. A light-emitting device can be mechanically coupled and attached to the heat sink while simultaneously electrically coupling and connecting the light-emitting device. A lamp shade can be secured to the heat sink proximal to the base with the light-emitting device disposed within the lamp shade and at least a portion of the body of the heat sink forming a decorative portion extending outward from the lamp shade.

33 Claims, 16 Drawing Sheets

U.S. PATENT DOCUMENTS

| | | |
|---|---|---|
| 7,494,248 B2 | 2/2009 | Li |
| D588,298 S | 3/2009 | Sabernig |
| 7,497,596 B2 * | 3/2009 | Ge .................................. 362/294 |
| 7,549,786 B2 | 6/2009 | Higley et al. |
| D596,337 S | 7/2009 | Sabernig |
| D604,006 S | 11/2009 | Silver |
| D620,179 S | 7/2010 | Sabernig |
| D620,182 S | 7/2010 | Sabernig |
| 7,959,332 B2 | 6/2011 | Tickner et al. |
| D641,096 S | 7/2011 | Markle et al. |
| 2007/0230172 A1 | 10/2007 | Wang |
| 2008/0165535 A1 | 7/2008 | Mazzochette |
| 2009/0129086 A1 | 5/2009 | Thompson, III |
| 2010/0157605 A1 * | 6/2010 | Chang et al. .................. 362/294 |
| 2010/0277916 A1 * | 11/2010 | Kira ......................... 362/249.02 |
| 2011/0063843 A1 | 3/2011 | Cook |
| 2011/0242813 A1 | 10/2011 | Markle et al. |
| 2011/0242815 A1 | 10/2011 | Markle et al. |

OTHER PUBLICATIONS

Notice of Allowance for U.S. Appl. No. 29/364,639 dated Mar. 4, 2011.

Non-final Office Action for U.S. Appl. No. 12/751,477 dated Sep. 5, 2012.

* cited by examiner

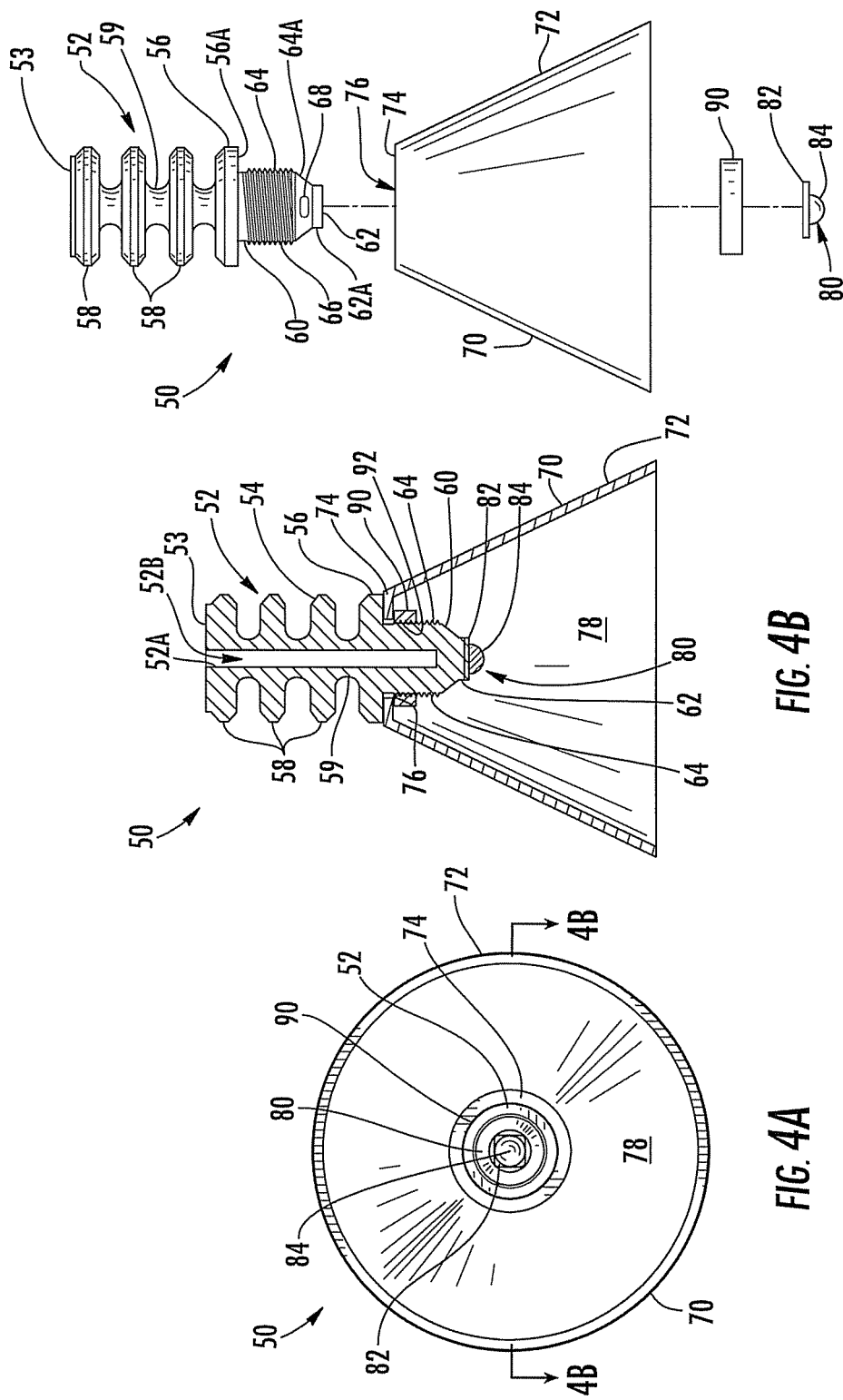

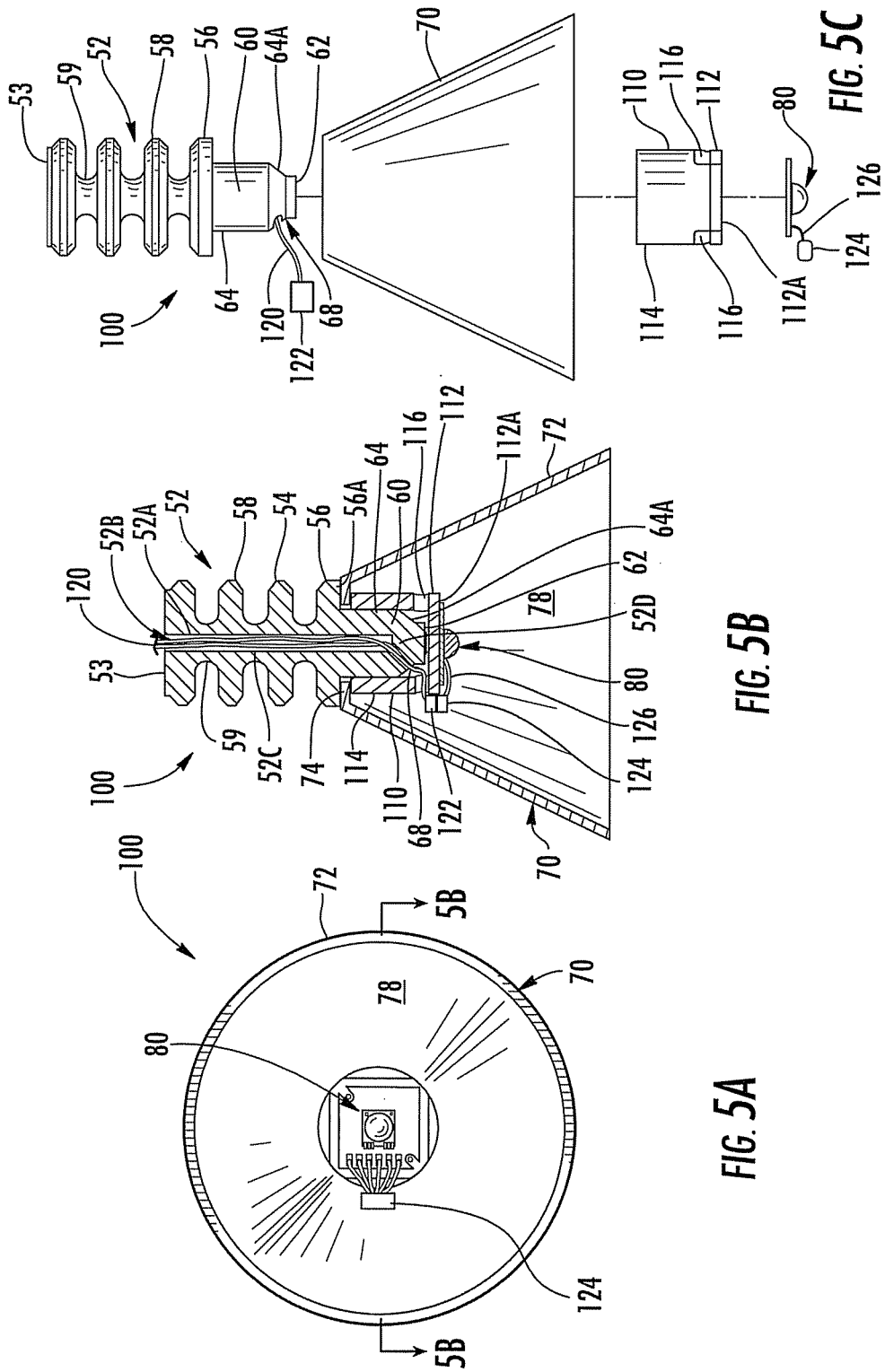

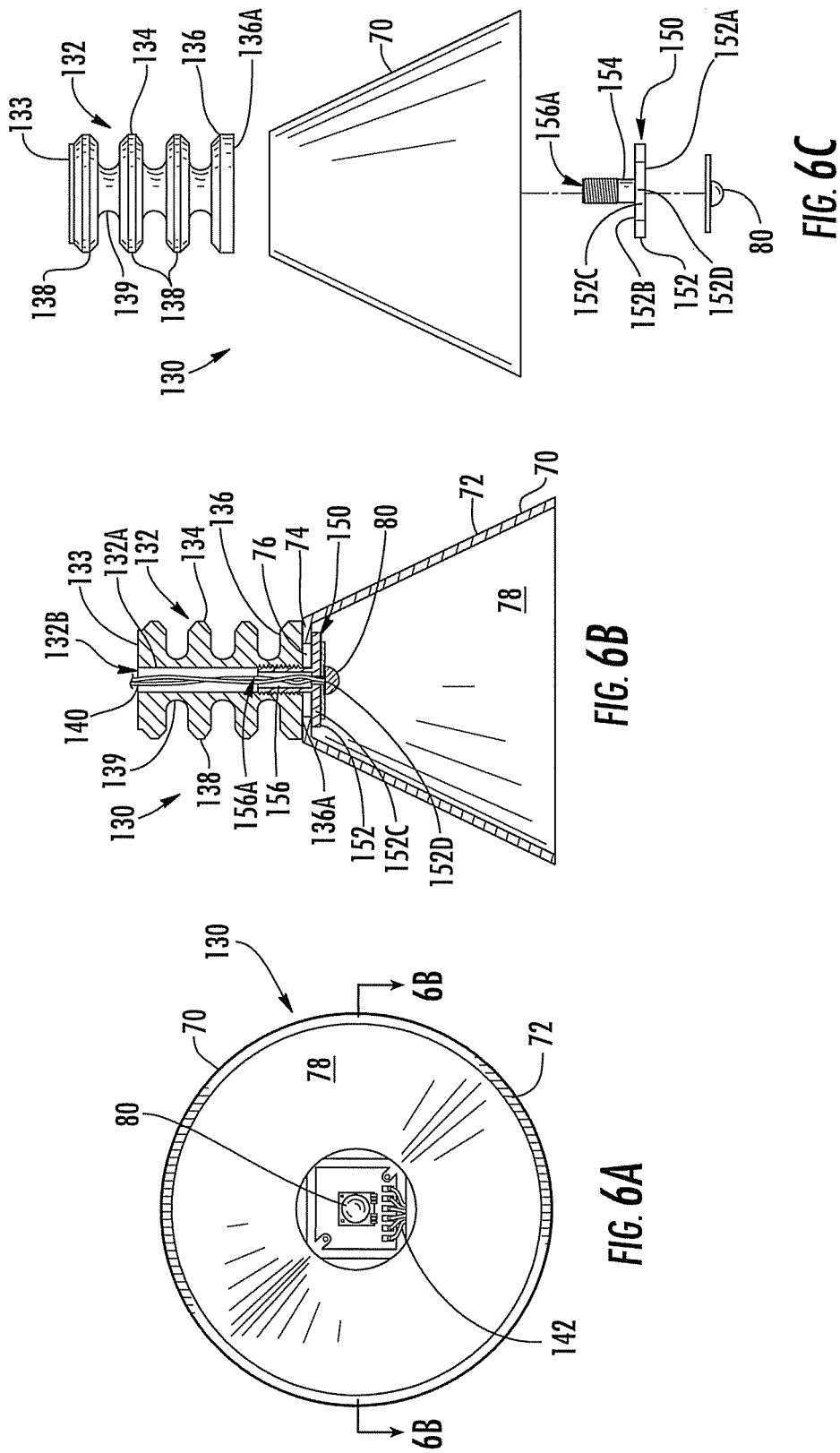

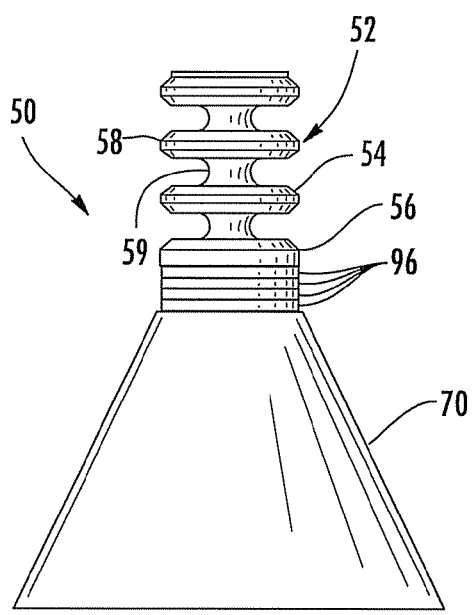
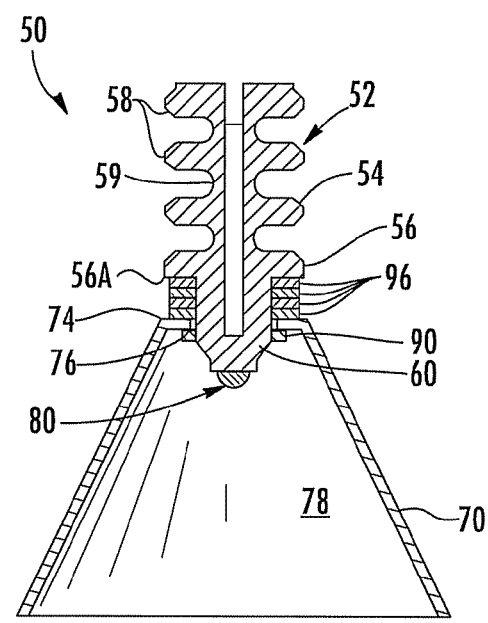
FIG. 8A
FIG. 8B

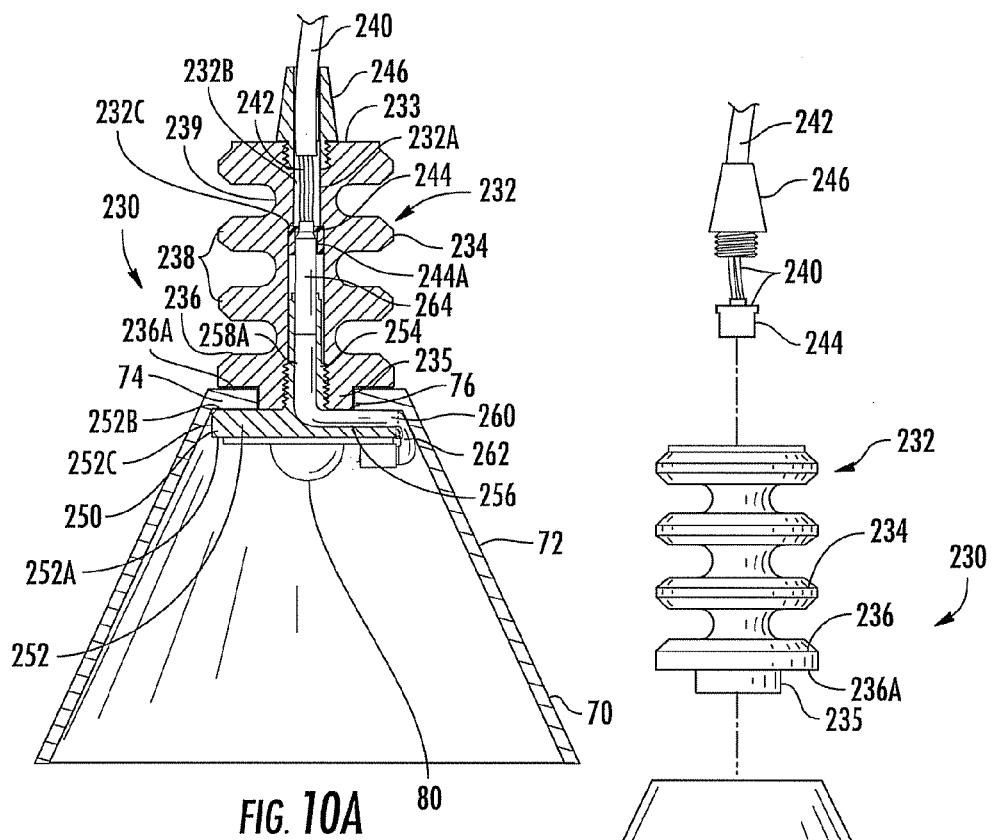
FIG. 10A
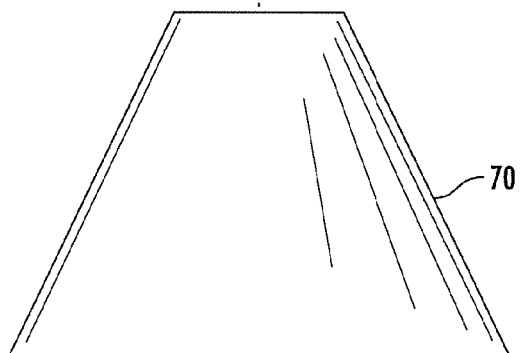
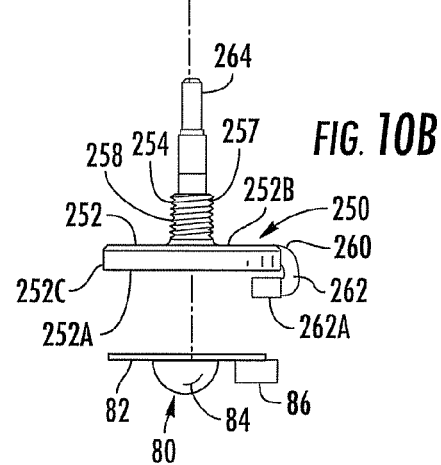
FIG. 10B

DECORATIVE AND FUNCTIONAL LIGHT-EMITTING DEVICE LIGHTING FIXTURES

CROSS REFERENCE TO RELATED APPLICATIONS

This application is a continuation-in-part of and claims priority benefit to co-pending U.S. patent application Ser. No. 12/751,477, filed Mar. 31, 2010, the entire content of which is hereby incorporated by reference herein.

TECHNICAL FIELD

The present subject matter relates generally to lighting fixtures using light-emitting devices. More particularly, the present subject matter relates to lighting fixtures such as luminaires with heat sinks that are both decorative and functional by providing heat dissipation for light-emitting devices used therein.

BACKGROUND

Solid-state lighting is becoming increasingly important in the lighting industry. Solid-state lighting refers to a type of lighting that uses light-emitting devices with light-emitting diodes (LEDs) such as, for example, semiconductor light-emitting diodes, organic light-emitting diodes, or polymer light-emitting diodes as sources of illumination rather than electrical filaments, plasma (used in arc lamps such as fluorescent lamps), or gas.

Various implementations of light-emitting diode lighting fixtures are becoming available in the marketplace to fill a wide range of applications. Lighting applications in which light-emitting diodes can be used can comprise domestic lighting, billboard and display lighting, automotive and bicycle lighting, emergency lighting, traffic and railway lighting, and floodlight and flashlight use. Light-emitting diodes are smaller than incandescent bulbs and use less energy. In addition, light-emitting diodes have a longer life than standard incandescent light bulbs. Accordingly, the use of light-emitting diodes in lighting applications can provide significant energy savings, increased lamp life, smaller lamp size, and flexibility in the design. For these reasons, lighting manufacturers are increasingly interested in unique lighting fixtures incorporating light-emitting diodes that may also have appeal to their intended customers.

One such lighting fixture type is the pendant lamp although the disclosure herein can pertain to any suitable lighting fixtures, including for example pendant lamps or a non-pendant lamp type lighting fixture. Pendant lamps are popular hanging luminaires that have traditionally been the province of A-form incandescent bulbs and more recently self-ballasted compact fluorescent lamps (CFLs). Pendant lamps are not particularly efficient lighting fixtures. Large fractions of flux from the illumination source are absorbed by the pendant lamp shade. The fixtures, however, offer a pleasing "glow" and "look" and so enjoy considerable popularity.

While providing many benefits, using light-emitting devices with light-emitting diodes in pendant lamps or other similar lighting fixtures creates a large amount of heat. Due to the size and structure of the pendant lamps, using traditional heat sinks large enough to maintain a desired heat is undesirable.

SUMMARY

In accordance with this disclosure, decorative and functional light-emitting device lighting fixtures are provided such as luminaires that can be pendant lamps. It is, therefore, an object of the present disclosure to provide light-emitting device lighting fixtures with both decorative and functional features. It is also an object of the present disclosure to provide luminaires with heat sinks that are both decorative and functional.

These and other objects of the present disclosure as can become apparent from the present disclosure are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIG. 4A illustrates a bottom plan view of an embodiment of a luminaire with a heat sink according to the present subject matter;

FIG. 4B illustrates a cross-sectional view of the luminaire with heat sink shown in FIG. 4A taken along line 4B-4B of FIG. 4A;

FIG. 4C illustrates an exploded view of the luminaire with heat sink shown in FIG. 4A;

FIG. 5A illustrates a bottom plan view of another embodiment of a luminaire with a heat sink according to the present subject matter;

FIG. 5B illustrates a cross-sectional view of the luminaire with heat sink shown in FIG. 5A taken along line 5B-5B of FIG. 5A;

FIG. 5C illustrates an exploded view of the luminaire with heat sink shown in FIG. 5A;

FIG. 6A illustrates a bottom plan view of a further embodiment of a luminaire with a heat sink according to the present subject matter;

FIG. 6B illustrates a cross-sectional view of the luminaire with heat sink shown in FIG. 6A taken along line 6B-6B of FIG. 6A;

FIG. 6C illustrates an exploded view of the luminaire with heat sink shown in FIG. 6A;

FIG. 8A illustrates a side view of a portion of another embodiment of a luminaire and heat sink with thermal stackers according to the present subject matter;

FIG. 8B illustrates a cross-sectional view of the luminaire with heat sink shown in FIG. 8A;

FIG. 10A illustrates a cross-sectional view of a further embodiment of a luminaire with a heat sink according to the present subject matter;

FIG. 10B illustrates an exploded view of the luminaire with heat sink shown in FIG. 10A;

DETAILED DESCRIPTION

Reference will now be made in detail to possible embodiments of the present subject matter, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present invention. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion.

Furthermore, relative terms such as "on", "above", "top", or "bottom" are used herein to describe one structure's or portion's relationship to another structure or portion as illustrated in the figures. It will be understood that relative terms such as "on", "above", "top", or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Figure 1:
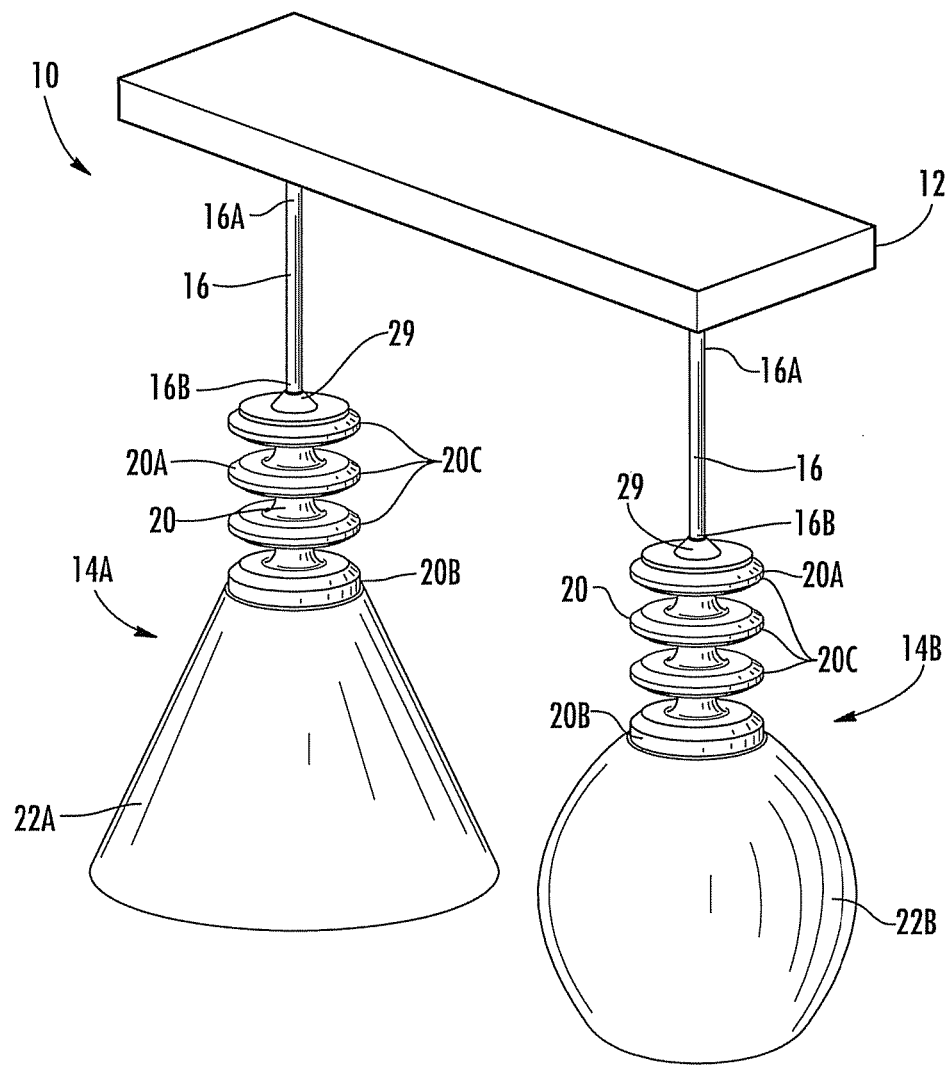
FIG. 1 illustrates a perspective view of an embodiment of a luminaire with a heat sink according to the present subject matter.

FIG. 1 illustrates a luminaire in the form of a pendant lamp fixture, generally designated 10. Pendant lamp fixture 10 is generally a hanging luminaire that can be installed to hang from a support such as a ceiling of a room although any suitable light fixture could be utilized in accordance with the subject matter described herein. For example, the fixture could be on, part of or comprise a stand or arm or any other suitable support structure. Pendant lamp 10 can comprise a base 12 for attachment to the support or ceiling. A pendant lamp can have a single lighting fixture or multiple lighting fixtures. In the embodiment shown in FIG. 1, pendant lamp fixture 10 comprises two lighting fixtures generally designated 14A and 14B. Each light fixture 14A, 14B can comprise one or more electrical connectors 16 such as electrically conductive wiring that can extend downward from base 12. The electrical connectors 16 for lighting fixtures 14A and 14B can each comprise a proximal end 16A and a distal end 16B and provide an electrical path as shown and described herein. The proximal end 16A of each lighting fixture 14A and 14B can be disposed in base 12 and can be electrically connected with a driver, or drive circuitry (shown in FIG. 2) that can be concealed in base 12. The driver can be an off-the-shelf product, for example, a non-dimmable or dimmable power supply.

Each lighting fixture 14A and 14B of pendant lamp fixture 10 can comprise a heat sink 20 that can comprise a body 20A that can have a base 20B. Heat sinks 20 of lighting fixtures 14A and 14B of pendant lamp fixture 10 can be disposed at the distal end 16B of the electrical connectors 16 with the electrical connectors 16 extending through heat sink 20 such that the electrical path extends through heat sink 20. Each heat sink 20 can comprise a light-emitting device (not shown in FIG. 1) that is attached thereto. By having the distal end 16B of the electrical connectors 16 at a distance from the driver, the heat removal and dissipation by the heat sink from the light-emitting device does not generally affect the driver. The light-emitting device can engage the electrical connectors 16 such that the driver is electrically connected to the light-emitting device through the electrical path. Strain relief compression fittings 29, or other equivalent fittings, can be used where the electrical connectors 16 enter heat sinks 20. Similar compression fittings can be used at the juncture of where the electrical connectors 16 enter the base 12.

Heat sinks 20 can be made from thermally conductive material, for example, metals, such as aluminum, copper, silver, or the like. Similarly, heat sinks 20 can be made from thermally conductive polycarbonate material. Heat sinks 20 can be molded or machined out of such material.

Each lighting fixture 14A and 14B of pendant lamp fixture 10 can further comprise a lamp shade. For example, the lighting fixture 14A can comprise a lamp shade 22A and the lighting fixture 14B can comprise a lamp shade 22B. Each lamp shade 22A, 22B is securable to the respective heat sink 20 proximal to the base 20B such as for example by a lamp shade mount on heat sink 20 as described and shown herein with the light-emitting device disposed within the lamp shades.

The lamp shades 22A, 22B illustrate different shapes and can be different colors to create different lighting patterns. For example, as shown in FIG. 1, lamp shade 22A illustrates a diverging conical-shaped shade and lamp shade 22B creates a bulb-shaped shade. As will be explained in more detail below, different shapes of shades will create different areas of direct illumination. The illumination of each luminaire can also be affected by the color and materials used in the shade. In luminaires that have more than one lighting fixture, the lamp shades usually will be made of the same material and have the same shape and color.

As shown in FIG. 1, the bodies 20A of heat sinks 20 extend above the lamp shades 22A, 22B upon attachment of heat sinks 20 to lamp shades 22A, 22B such that at least a portion of the bodies 20A forms a decorative top portion extending outward from lamp shades 22A, 22B. Bodies 20A of heat sinks 20 can have different decorative shapes. For example, bodies 20A of heat sinks 20 can have any suitable structures such as fins 20C that are spaced apart from each other. Fins 20C can be, for example, circular fins that can be at least partially concentrically and coaxially disposed as part of heat sink 20. Fins 20C can generally extend transverse to a core of each body 20A. Fins 20C also can serve a functional purpose of increasing the surface area of each body 20A to increase heat dissipation. Additionally, each heat sink 20 can provide strain relief for the connections between the electrical connectors 16 and the light-emitting device and on the light-emitting device itself. Heat sinks 20 also provide shade and general lamp support.

Figure 2:
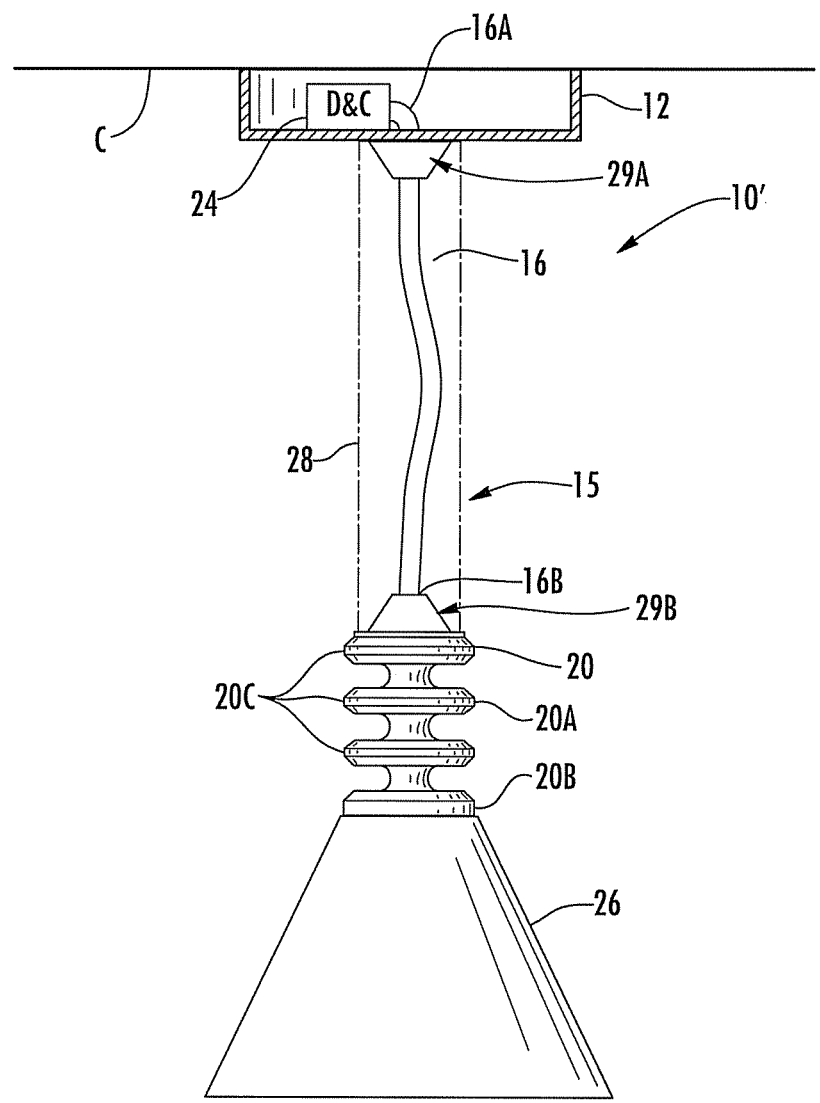
FIG. 2 illustrates a partially cross-sectioned side view of an embodiment of a luminaire with a heat sink according to the present subject matter.

As shown in FIG. 2, a luminaire in the form of a pendant lamp, generally designated 10' is provided. Pendant lamp 10' can be installed on any suitable support structure and orientation can be other than that shown even. For illustration purposes, the support structure is shown herein as ceiling C of a room. Pendant lamp 10' can comprise base 12 for attachment to ceiling C and base 12 can have one or more drivers 24 that can be positioned therein. Pendant lamp 10' as shown in FIG. 2 has a single lighting fixture generally designated 15 that can comprise electrical connector 16 such as electrically conductive wiring that extends downward from base 12. Electrical connector 16 for lighting fixture 15 can comprise a proximal end 16A and a distal end 16B. Proximal end 16A of lighting fixture 15 can be disposed in base 10 and electrically connected with driver 24 that is contained and concealed in base 10. Strain relief compression fittings 29A can be used where electrical connector 16 enters base 12 and strain relief compression fittings 29A can also be used where the electrical connector 16 enters heat sink 20. A hanger conduit 28 (shown in phantom) can optionally be disposed over and around electrical connector 16 and can engage and be secured against base 12 and heat sink 20. For example, hanger conduit 28 can be screwed into base 12 and heat sink 20. Electrical connector 16 can extend through hanger conduit 28 with reduced strain, thereby better protecting electrical connector 16 and the light-emitting device electrically associated therewith.

Heat sink 20 of lighting fixture 15 of pendant lamp 10' can comprise a body 20A with a base 20B. Heat sink 20 can be disposed at the distal end 16B of electrical connector 16 with electrical connector 16 extending through heat sink 20 as described further below. A light-emitting device (shown subsequently) can be attached to a surface of heat sink 20. The light-emitting device can engage electrical connector 16 such that the driver 24 is electrically connected to the light-emitting device in a less strained way due to the interactions and configurations of electrical connector 16, heat sink 20, and the light-emitting device. Lighting fixture 15 of pendant lamp 10' can further comprise a lamp shade 26. The lamp shade 26 is securable to heat sink 20 proximal to base 20B with the light-emitting device disposed within lamp shade 26.

A hanger conduit 28 is shown in phantom dotted lines in FIG. 2. Hanger conduit 28 can be used to relieve stress on electrical connector 16 and the light-emitting device. Hanger conduit 28 can be secured to base 12 and heat sink 20. For example, hanger conduit 28 can have threaded ends that can be screwed into the appropriate threaded apertures in base 12 and heat sink 20 so that tension in electrical connector 16 is at least partially removed. Electrical connector 16 can extend through hanger conduit 28 with reduced strain due to the expected slack in electrical connector 16, thereby better protecting electrical connector 16 and the light-emitting device.

Figure 3A:
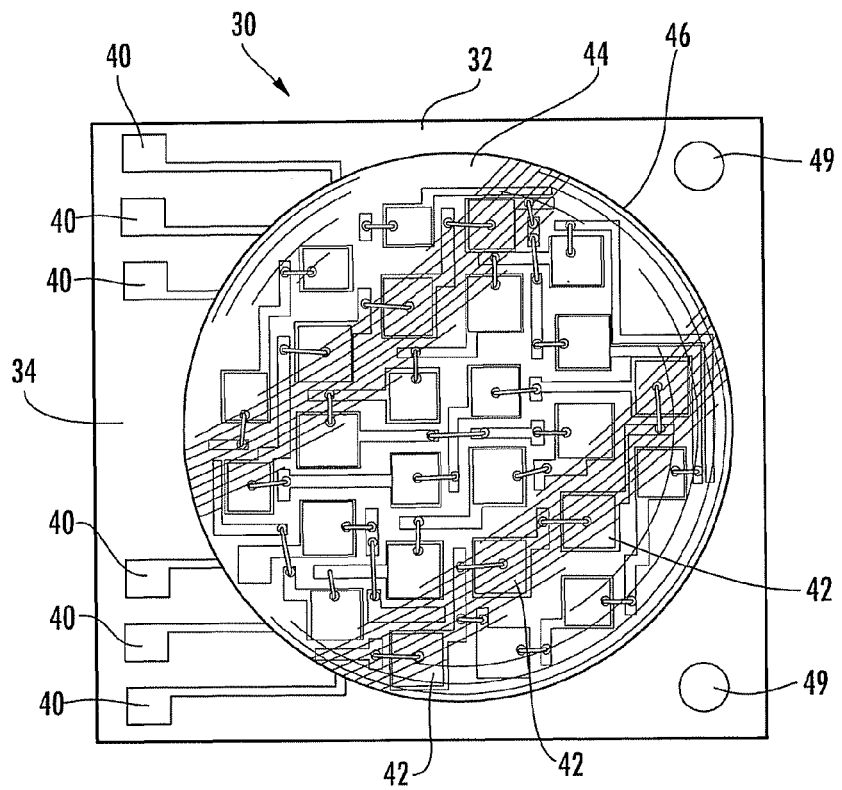
FIG. 3A illustrates a top view of an embodiment of a light-emitting diode package that can be part of lamp assemblies according to the present subject matter.
Figure 3B:
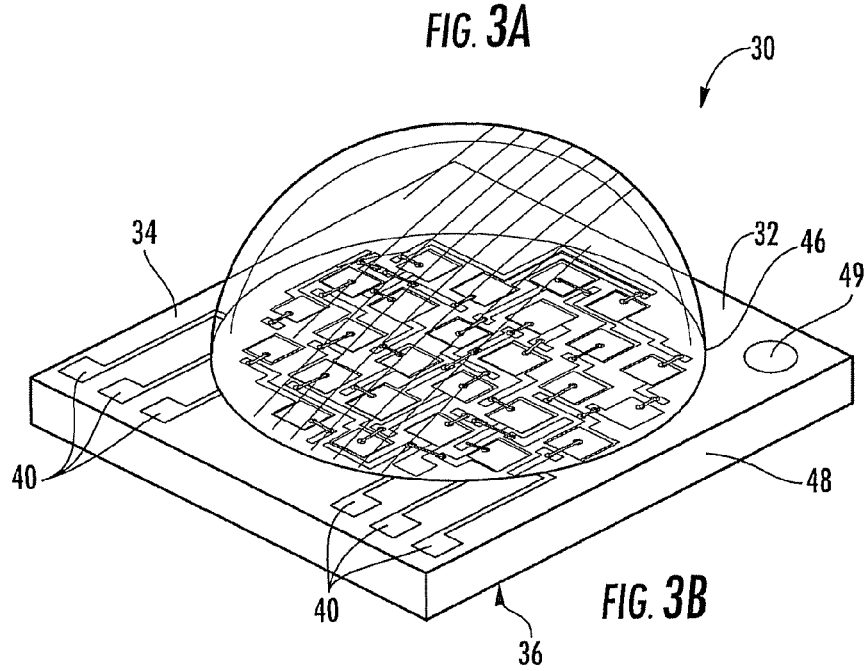
FIG. 3B illustrates a perspective view of the light-emitting diode package shown in FIG. 3A.

Different light-emitting device packages and lamp assemblies can be used with the luminaires disclosed herein. For example, various patents and patent applications assigned to the assignee of the present application disclose light-emitting device packages that can used in such luminaires. See, for example: U.S. Pat. No. 7,549,786; U.S. application Ser. No. 12/335,631 filed Dec. 16, 2008; U.S. patent application Ser. No. 12/574,918 filed Oct. 7, 2009; and U.S. patent application Ser. No. 12/579,946 filed on Oct. 15, 2009, all of which are incorporated by reference herein in their entireties. FIGS. 3A and 3B illustrate examples of light-emitting device packaging arrangements having top mounted electrical contacts that can be used in luminaires disclosed herein.

FIGS. 3A and 3B illustrate a light-emitting diode package 30 that can be used in the lamp assemblies disclosed herein. Although one light-emitting diode package 30 is illustrated, more than one light-emitting diode package 30 can also be used such as in an array. Light-emitting diode package 30 can comprise a substrate 32 having a top surface 34 and bottom surface 36. Substrate 32 can be a material such as, for example, silicon, copper, silver, FR4, aluminum, thermally conductive polycarbonate, or other suitable material. Substrate 32 may be formed of many different materials, including electrically insulating materials. Suitable substrate materials also can comprise, but are not limited to, ceramic materials such as aluminum nitride (AlN) and alumina ($Al_2O_3$). Dimensions of substrate 32 can vary widely depending on the applications and processes used to manufacture light-emitting diode package 30 and the lamp assembly in which it is used.

Light-emitting diode package 30 can comprise electrical contacts 40. In one aspect, electrical contacts 40 can be disposed only on the top surface 34 of the substrate 32. For example, electrical contacts 40 can be electrically connected to one or more light-emitting diode structures such as chips 42 (see FIG. 3A) or any other suitable structure known now or later in any suitable manner known by one of skill in the art. In the embodiment shown in FIGS. 3A and 3B, six electrical contacts 40 are shown. The number of electrical contacts 40 can vary and can be dependent upon the number of light-emitting diode chips 42 used in the light-emitting diode package 30. The number of light-emitting diode chips 42 can, for example, vary between about 1 to about 25 or more for a given package size. More light-emitting diode chips such as chips 42 can be provided in larger package sizes. Light-emitting diode chips 42 can be connected in series. For example, alternating lines of red light producing light-emitting diode chips 42 and white light producing light-emitting diode chips 42 can be used in the light-emitting diode package 30. Thus, the manner in which light-emitting diode chips 42 are connected can also affect the number of electrical contacts 40 in light-emitting diode package 30.

By having electrical contacts 40 only on top surface 34 of substrate 32 as shown in one aspect, light-emitting diode package 30 can be formed on a larger wafer of the substrate material with the wafer being cut into individual light-emitting diode packages 30 with substrate 32 having sides 48. While substrate 32 is shown to have a rectangular plan view shape, substrate 32 can vary in size and shape. Top surface 34 can also comprise markers 49 that can aid a user in determining the orientation of light-emitting diode package 30 when being installed.

Light-emitting diode chips 42 can be covered by a lens 44 that can be formed of different material. For example, encapsulation material can be used to encapsulate light-emitting diode chips 42 and their associated bonding wires and mounting pads in a compression mounting process to form lens 44. Other lens material can be used. In the embodiment shown, lens 44 can be formed into a domed shape. The dome shape of lens 44 can be generally a hemispherical shape with base 46 of lens 44 having the greatest diameter. Other lens shapes that have a base can be used.

Light-emitting diode package 30 shown in FIGS. 3A and 3B or similar light-emitting diode packages with electrical contacts on the top surface of the substrate can be used in the luminaires and placed on the heat sinks shown in FIGS. 4A-9A.

FIGS. 4A-4C illustrate a portion of a luminaire in the form of a pendant lamp generally designated 50. Pendant lamp 50 can comprise a heat sink 52 with a body 54. Body 54 can comprise a base 56 against which a lamp shade 70 can reside. Lamp shade 70 can have walls 72 that extend downward from a top portion 74 positioned against a bottom surface 56A of the base 56. Walls 72 can be any shape and configured to be aesthetically pleasing. In the embodiment shown, walls 72 diverge outward from the top portion 74 of lamp shade 70.

Heat sink 52 can have a decorative shape that can extend above lamp shade 70. In the embodiment shown and for illustration only, the decorative design has three circular fins 58 that are spaced apart and extend out from a central core 59. Core 59 can extend upward from base 56 of body 54 of heat sink 52. More or less fins 58 can be used, and fins 58 can be symmetrical or asymmetrical in relation to the core. Fins 58 can also extend in various and/or different angles from the core. In one example, fins 58 can extend transversely to the core. As described above, the shape of fins 58 serves a functional purpose of increasing the surface area of body 54 of heat sink 52 to increase heat dissipation. The distance of spacing between fins 58 can also facilitate heat dissipation. The design of body 54 of heat sink 52 also provides an aesthetically pleasing shape that adds to appearance and style pendant lamp 50. In this manner, heat sink 52 serves a dual function. While circular fins are shown, the shape of body 54 that extends above lamp shade 70 can be any shape that is both aesthetically pleasing and provides adequate heat dissipation for a light-emitting device 80 attached to heat sink 52.

Light-emitting device 80 can be attached to heat sink 52 in different ways. For example, the light-emitting device 80 can be attached by epoxy or some other more permanent or semi-permanent adhesive or substance. Alternatively, light-emitting device 80 can be removably attached by devices such as clips that hold light-emitting device 80 in place on heat sink 52. Examples of such devices are disclosed in U.S. Pat. No. 7,549,786 and U.S. patent application Ser. No. 12/579,946 filed on Oct. 15, 2009, both of which have been incorporated herein by reference in their entireties.

In the embodiment shown in FIGS. 4A-4C, heat sink 52 can comprises a head 60 extending from body 54 of heat sink 52. In the embodiment shown, head 60 is a smaller diameter or cross-sectional shape than base 56 at bottom surface 56A. Head 60 can have a diameter or cross-sectional area that allows head 60 to be inserted through an opening 76 formed in the top portion 74 of lamp shade 70 while top portion 74 can abut against bottom surface 56A of base 56. In this manner, head 60 can be inserted into an inner space 78 of lamp shade 70. The depth at which the head 60 extends into the inner space 78 of the lamp shade 70 can vary depending on the desired lighting effect in relation lamp shade 70. The depth at which head 60 extends into inner space 78 can be varied by the length of head 60 from the base to a distal end 62 of head 60. Spacing devices can be used between the base 56 and the lamp shade 70, examples of which are described further below. The placement position of the light-emitting device or devices on head 60 can also affect the desired depth at which head 60 extends into inner space 78.

In the embodiment shown, distal end 62 of head 60 positioned distally from base 56 forms a platform on which light-emitting device 80 can be attached. Light-emitting device 80 can be a light-emitting diode package as shown in FIGS. 3A and 3B above. Such light-emitting devices 80 can comprise a substrate 82 and a lens 84. Such light-emitting devices 80 can generate a large amount of heat that the decorative heat sink 52 can efficiently remove and dissipate. The light output from such a light-emitting device 80 can be directed equally in all directions from a plane aligned with substrate 82 of light-emitting device 80. Different lenses 84 and/or secondary optics can be used to change the nature and direction of the light as desired. However, such different lenses or secondary optics are not necessary. The depth at which head 60 can extend into inner space 78 of lamp shade 70 can be important with such light-emitting devices 80 to ensure adequate illumination of lamp shade 70 and to control heating of lamp shade 70. Head 60 can comprise side walls 64 that extend downward from base 56. The side walls 64 of head 60 can form any cross-sectional shape that permits them to be inserted in the opening 76 of the top portion 74 of lamp shade 70. For example, as shown in FIGS. 4A-4C, head 60 can for a circular cross-sectional shape. Side walls 64 can have threads formed therein.

A retainer ring 90 can be provided that engages head 60 of heat sink 52 to secure lamp shade 70 to heat sink 52. The retainer ring 90 can be made from various material including thermally conductive and/or non-conductive materials. In the embodiment shown, the retainer ring 90 can comprise inner walls 92 that are threaded to permit the retainer ring 90 to be screwed onto the head 60 to abut against the top portion 74 of the lamp shade 70 so that the top portion 74 is sandwiched between the base 56 and the retainer ring 90. The retainer ring 90 and head 60 can be designed in different ways to engage one another. For example, the side walls of the head and retainer ring can be configured to be press fit to retain the lamp shade to the heat sink. The retainer ring can be elastic to create a tight fit. The head and retainer ring can have additional designs, shapes and configurations that permit securement of the lamp shade.

As shown in FIGS. 8A and 8B, thermal washers or stackers 96 that act as spacers can be provided for use in embodiments of a luminaire 50 with a heat sink 52 that comprises a head 60 to adjust the position of the light-emitting device 80 within the inner space 78 of lamp shade 70. One or more thermal stackers such as stackers 96 that contribute to the decorative features of heat sink 52 and act as washers or spacers and also facilitate heat removal and dissipation can be placed around the head 60 between top portion 74 of lamp shade 70 and base 56 of body 54 of the heat sink. By using one or more thermal stackers 96 around head 60 of heat sink 52 between base 56 of body 54 of heat sink 52 and lamp shade 70, the position of the light-emitting device 80 can be adjusted relative to lamp shade 70. Stackers 96 can vary in shape and design. When utilized between base 56 of heat sink 52 and lamp shade 70, and in addition to providing structural and alignment support to pendant lamp 50, thermal stackers 96 can also provide both desirable decorative and thermal advantages as thermal stackers 96 can provide desired thermal conductivity to further remove heat from heat sink 52 and assist in overall heat dissipation for increased thermal performance.

Referring to FIGS. 4B and 8B, heat sink 52 can comprise an inner wall 52A with an aperture 52B for receiving one or more electrical connectors, such as electrically conductive wiring. Aperture 52B can extend from an end of heat sink 52 distal from base 56, for example, top end 53, through head 60 of heat sink 52. Inner wall 52A can form an outlet 68 of the aperture 52B in head 60 of heat sink 52. For example, aperture 52B can have a first section that extends along a central axis running through the core 59 of heat sink 52. Aperture 52B can have a second section that can extend from the first section through a side wall 64 of head 60 to form outlet 68. For example, outlet 68 can be formed in a tapered section 64A of side walls 64 proximal to a platform section 62A of end 62 of head 60. Outlet 68 can be oblong to facilitate passage of the electrical connector such as wiring through aperture 52B and out outlet 68. In this manner, heat sink 52 can provide strain relief for the electrical connectors and the light-emitting device and provides shade and lamp support.

Light-emitting device 80 can have the cathode and anode pads on the surface of the substrate opposite the lens in some embodiments. In such embodiments, the electrical connectors can be connected to the light-emitting device without exiting the heat sink 52. In such embodiments, the apertures and openings in body 54 and head 60 of heat sink 52 can be modified appropriately if needed.

FIGS. 5A-5C illustrate a portion of an embodiment of a luminaire in the form of a pendant lamp generally designated 100. Portions of pendant lamp 100 can be similar or identical to pendant lamp 50 shown in FIGS. 4A-4C. The same reference numerals used in the FIGS. 4A-5C indicate like parts. Pendant lamp 100 can comprise a heat sink 52 that comprises a body 54. Body 54 can comprise a base 56 against which a lamp shade 70 can reside. Lamp shade 70 can have walls 72 that extend downward from a top portion 74 positioned against a bottom surface 56A of base 56. As above, walls 72 of lamp shade 70 can be any aesthetically pleasing shape.

Heat sink 52 can have a decorative shape that can extend above lamp shade 70. In the embodiment shown, the decorative design can comprise fins 58 that can be spaced apart and extend out from central core 59. As described above, the shape of fins 58 serves a functional purpose of increasing the surface area of body 54 of heat sink 52 to increase heat dissipation. The distance of spacing between fins 58 can also facilitate heat dissipation. The design of body 54 of heat sink 52 also provides an aesthetically pleasing shape that adds to appearance and style of pendant lamp 50. In this manner, heat sink 52 serves multiple functions that also comprise shade and/or lamp support and strain relief. While circular fins are shown, the shape of body 54 that extends above lamp shade 70 can be any shape that is both aesthetically pleasing and provides adequate heat dissipation for a light-emitting device 80 attached to heat sink 52.

In the embodiment shown in FIGS. 5A-5C, heat sink 52 also comprises a head 60 extending from body 54 of heat sink 52. Head 60 can have a diameter or cross-sectional area that allows head 60 to be inserted through an opening 76 formed in top portion 74 of lamp shade 70 while top portion 74 can abut against bottom surface 56A of base 56 so that head 60 can be inserted into an inner space 78 of lamp shade 70. As with the embodiment shown in FIGS. 4A-4C, the depth at which head 60 extends into inner space 78 of lamp shade 70 can vary depending on the desired lighting effect in relation to lamp shade 70. The depth at which head 60 extends into inner space 78 can be varied in similar manners as described above.

In the embodiment shown, end 62 of head 60 distal from the base 56 forms a surface that can provide a thermal contact. Head 60 can comprise side walls 64 that extend downward from base 56. Side walls 64 of head 60 can form any cross-sectional shape that permit them to be inserted in the opening 76 of top portion 74 of lamp shade 70. For example, as shown in FIGS. 5A-5C, head 60 can have a circular cross-sectional shape. As above, side walls 64 can have threads formed thereon. Pendant lamp 100 can also comprise a cap 110 on which light-emitting device 80 can be attached that is configured to engage head 60 of heat sink 52. Cap 110 can comprise a base section 112 that forms a platform on outer surface 112A on which the light-emitting device 80 can be attached. Cap 110 can also comprise walls 114 that extend upward from base section 112 away from outer surface 112A. As shown in FIG. 5B, the cross-sectional area of the space between walls 114 can be such that cap 110 can be press fit onto head 60. For example, the diameter of the cross-section of side walls 64 of head 60 can be substantially similar to the cross-sectional space between walls 114 of cap 110 to provide a secure frictional engagement when cap 110 is press fit onto side walls 64. Alternatively, walls 114 of the cap 110 and side walls 64 of head 60 can be matchingly threaded.

Upon securement of cap 110 to head 60, end 62 of head 60 can be in thermal contact with base section 112 of cap 110 along with walls 114 of cap 110 being in thermal contact with side walls 64 to conduct heat away from light-emitting device 80 on outer surface 112A of base section 112 of cap 110. As above, light-emitting device 80 can be a light-emitting diode package as shown in FIGS. 3A and 3B above. However, any light-emitting device package can be used.

As shown in FIG. 5B, the electrical connector 120 (not shown in cross-section) can extend through heat sink 52. In particular, the heat sink 52 can comprise an inner wall 52A that can define an aperture 52B for receiving one or more electrical connectors 120, such as electrically conductive wiring. Aperture 52B can extend from an end of heat sink 52 distal from base 56, for example, top end 53, through head 60 of heat sink 52. Inner wall 52A can form an outlet 68 of aperture 52B in head 60 of heat sink 52. For example, aperture 52B can have a first section 52C that extends along a central axis running through core 59 of heat sink 52. Aperture 52B can have a second section 52D that can extend from first section 52C through a side wall 64 of head 60 to form outlet 68. For example, outlet 68 can be formed in a tapered section 64A of side walls 64 proximal to end 62 of head 60. Cap 110 can also comprise one or more openings 116 in walls 114 and/or base section 112. Openings 116 in cap 110 permit electrical connector 120 that resides in the heat sink to be selectively passed through cap 110 to permit electrical connector 120 to connect with light-emitting device 80 on outer surface 112A of the base section.

Electrical connector 120 can extend through heat sink 52 for connection to light-emitting device 80. The connection can be made in different manners including soldered or spliced connections of electrically conductive wiring to ribbons that are connected to light-emitting device 80 or solder connections of electrically conductive wiring directly to light-emitting device 80. In the embodiment shown, a quick connection can be provided on both light-emitting device 80 and on the end of electrical connector 120. For example, a plug 122 can be provided on the end of the electrical connector 120 that can matingly engage a plug 124 on electrical connector 126 secured to light-emitting device 80. Examples of different plugs are shown and described, for example, in U.S. patent application Ser. No. 12/719,287 filed on Mar. 8, 2010, which is incorporated by reference herein in its entirety. Aperture 52B and outlet 68 in head 60 can be large enough to allow passage of plug 122 therethrough. Similarly, openings 116 in cap 110 can be large enough for the passage of either plug 122 on electrical connector 120 or plug 124 of electrical connector 126 secured to light-emitting device 80. Cap 110 can thus create a detachable platform the can attached and removed from heat sink 52. Cap 110 and plugs 122, 124 allow for easy changeability of the light-emitting device from the luminaire.

Some light-emitting devices 80 can have the cathode and anode pads on the surface of the substrate opposite the lens in some embodiments. In such embodiments, the electrical connectors can be connected to the light-emitting device without exiting heat sink 52. In such embodiments, the apertures and openings in body 54 of heat sink 52 and cap 110 can be modified appropriately if needed.

FIGS. 6A-6C illustrate a portion of another embodiment of a luminaire in the form of a pendant lamp generally designated 130. As above, the same reference numerals used in the FIGS. 4A-6C indicate like parts. Pendant lamp 130 can comprise a heat sink 132 that comprises a body 134. Body 134 of heat sink 132 can be similar to the embodiments disclosed above, however, heat sink 132 does not comprise a head section as described above. Body 134 of heat sink 132 can comprise a base 136 against which a lamp shade 70 can reside. As above, lamp shade 70 can have walls 72 that extend downward from a top portion 74 positioned against a bottom surface 136A of base 136. As above, walls 72 can be of any aesthetically pleasing shape.

Heat sink 132 can have a decorative shape that can extend above lamp shade 70. As in the other embodiments, the decorative design can comprises fins 138 that can be spaced apart and extend out from a central core 139. The shape of fins 138 provides increased surface area of body 134 of heat sink 132 and sufficient spacing between fins 138 to facilitate heat dissipation from light-emitting device 80 attached to heat sink 132. The design of body 134 of heat sink 132 also provides an aesthetically pleasing shape. In this manner, heat sink 132 serves multiple functions that also comprise shade and/or lamp support and strain relief. The shape of body 134 that extends above lamp shade 70 can be any shape that is both aesthetically pleasing and provides adequate heat dissipation for a light-emitting device 80 attached to heat sink 132.

Heat sink 132 illustrated in FIGS. 6A-6C can comprise an inner wall 132A that extends from a top surface 133 of heat sink 132 through the bottom surface 136A of base 136 of heat sink 136. Inner wall 132A defines an aperture 132B that extends through heat sink 132. Inner wall 132A can reside in heat sink 132 so that aperture 132B is aligned with a central axis (not shown) that runs through heat sink 132 in a vertical direction. Aperture 132B can be centered around the central axis.

In the embodiment shown in FIGS. 6A-6C, heat sink 132 can further comprise a platform 150 that can have light-emitting device 80 attached thereto. Platform 150 can be detachable from heat sink 132. Platform 150 can comprise a planar substrate 152. Planar substrate 152 can form a first surface 152A on which light-emitting device 80 is secured. Planar substrate 152 can also form a second surface 152B on a side opposite first surface 152A. Platform 150 can comprise a guide rod 154 that extends from second surface 152B. Guide rod 154 of platform 150 can be configured for insertion into aperture 132B to engage inner wall 132A of heat sink 132 at base 136 of heat sink 132. Guide rod 154 can engage the inner wall 132A of heat sink 132 in different manners. For example, there can be a locking mechanism such as a latch or hook mechanism in either guide rod 154 or inner wall 132A. Alternatively, guide rod 154 and inner wall 132A can form a frictional engagement such as a press fit. In the embodiment illustrated in FIGS. 6A-6C, inner wall 132A of heat sink 132 and guide rod 154 of the platform 150 are matchingly threaded, so that guide rod 154 and platform 150 can be screwed into inner wall 132A of heat sink 132. For example, guide rod 154 can have threads 158 on the exterior of guide rod 154.

Guide rod 154 of platform 150 can also comprise an inner wall 156 that defines an aperture 156A. Once guide rod 154 is inserted into inner wall 132A, aperture 156A in guide rod 154 can be aligned coaxially with aperture 132B formed by inner walls 132A in heat sink 132. In such an embodiment, platform 150 can also comprise a side 152C that forms an opening 152D therein. Opening 152D in side 152C can extend into aperture 156A in guide rod 154. In this manner, as will be explained below, the electrical connector can extend through platform 150.

Aperture 132B formed by inner wall 132A of heat sink 132 and aperture 156A formed by inner wall 156 of guide rod 154 of the platform that is in communication with opening 152D in side 152C of planar substrate 152 of the platform 150 together form a passage for receiving one or more electrical connector 140, such as electrically conductive wiring. Electrical connector 140 can extend through aperture 132B of heat sink 132 and aperture 156A and opening 152D in platform 150 for connection to light-emitting device 80. The connection can be made in different manners including a quick connection that uses plugs that can be provided on both light-emitting device 80 and on the end of electrical connector 140 or solder connection of wiring directly to light-emitting device 80. In the embodiment shown, ribbons 142 are provided that are electrically connected to the light-emitting device 80. Ribbons 142 are connected to the electrical connectors 140 that extend through heat sink 132 and platform 150 by soldering, splicing, or other common technique.

Some light-emitting devices 80 can have the cathode and anode pads on the surface of the substrate opposite the lens in some embodiments. In such embodiments, the electrical connectors can be connected to the light-emitting device without exiting the heat sink. In such embodiments, the apertures and openings in the body of heat sink and the platform may need to be modified appropriately.

Guide rod 154 of platform 150 can have a diameter or cross-sectional shape that allows guide rod 154 to be inserted through an opening 76 formed in top portion 74 of lamp shade 70. Planar substrate 152 of platform 150 can have a diameter or cross-sectional area that is wider than opening 76 in top portion 74 of lamp shade 70. In this manner, top portion 74 can abut against bottom surface 136A of base 136 and against second surface 152B of planar substrate 152 of platform 150 so that top portion 74 of lamp shade 70 is sandwiched between base 136 of body 134 and planar substrate 152 of platform 150. In this manner, lamp shade 70 can be held in place in pendant lamp 130.

In pendant lamp 130, heat sink 132 positions light-emitting device 80 at or near top portion 74 of the lamp shade due to the low profile of planar substrate 150 of platform 150. In such an embodiment, the light-emitting device can more fully illuminate lamp shade 70. Heat from light-emitting device 80 can pass through platform 150 into body 134 of heat sink 132 to dissipate heat.

Figure 7:
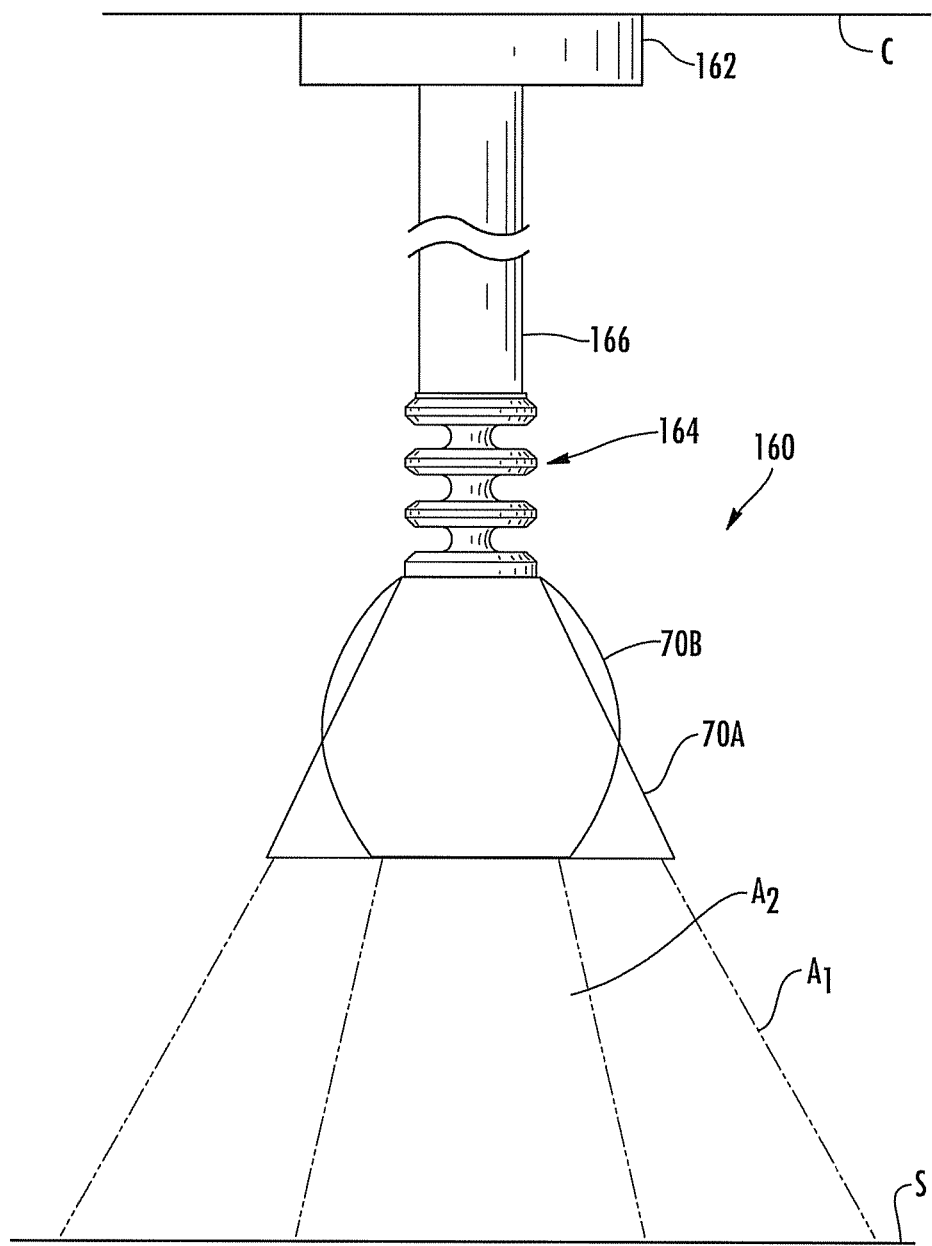
FIG. 7 is a side view of a luminaire illustrating different shades and the primary area of light from the respective shades according to the present subject matter.

Referring to FIG. 7, an illustration is provided that shows the area lighted or illuminated directly by or under a luminaire. A pendant lamp, generally 160, is provided that comprises a base 162 that is secured to a ceiling C and a heat sink 164. The driver and necessary circuitry can be secured in base 162. Electrical connectors can extend down through heat sink 164 to connect to a light-emitting device package attached to heat sink 164. Lamp 160 can also comprise a hanger conduit 166 that is secured to base 162 and heat sink 164. For example, hanger conduit 166 can be screwed into the appropriate outlets in base 162 and heat sink 164. The electrical connector can extend through hanger conduit 166 with reduced strain, thereby better protecting the electrical connectors and the light-emitting device.

Figures 9A, 9B:
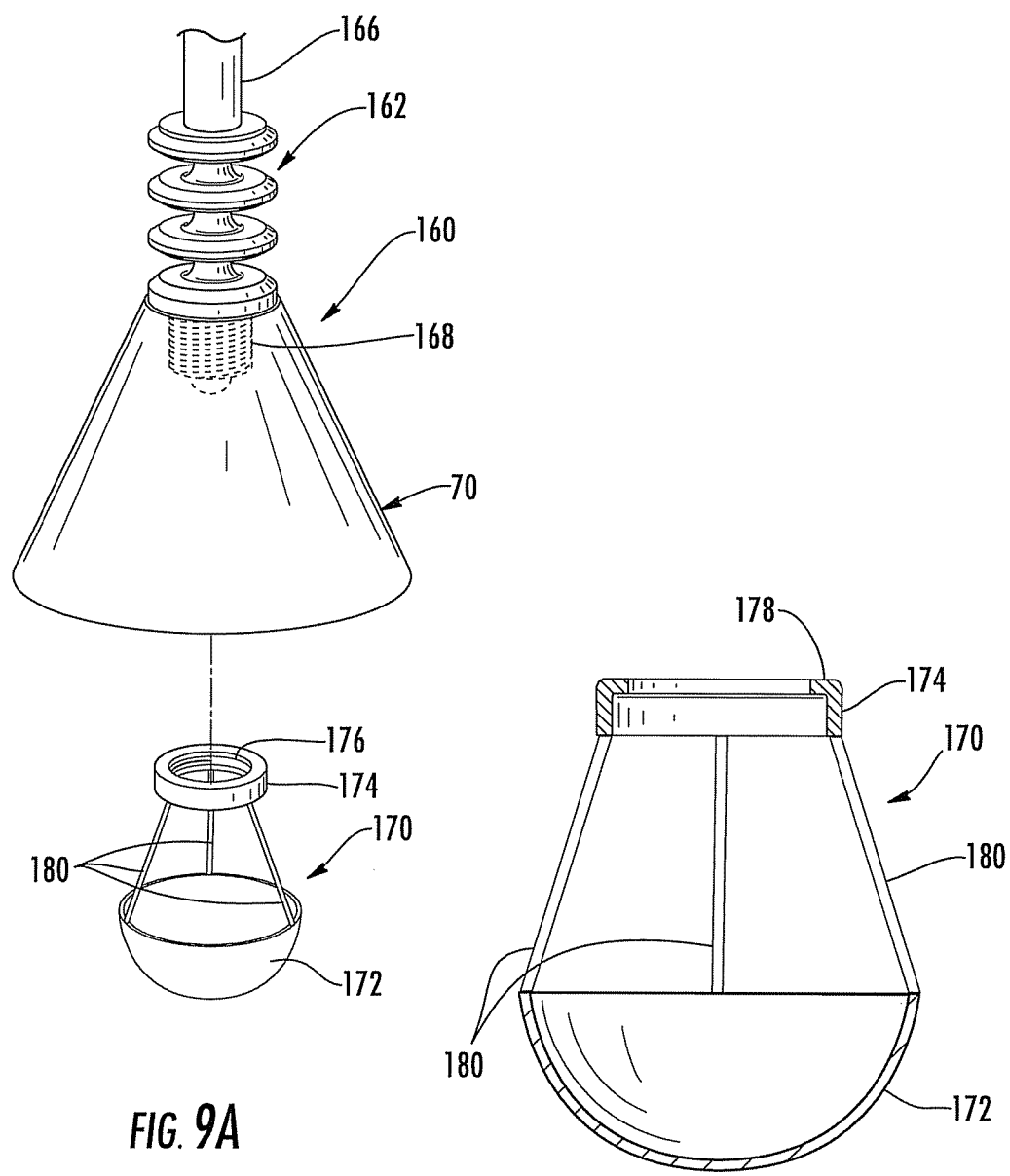
FIG. 9A illustrates a partially exploded perspective view of a portion of a further embodiment of a luminaire with heat sink with a diffuser according to the present subject matter.
FIG. 9B illustrates a cross-sectional view of the diffuser that can be used with the luminaire with heat sink shown in FIG. 9A.

As shown in FIG. 7, two different lamp shades, 70A and 70B are illustrated to demonstrate the illumination that is provided by the lamp shades 70A, 70B. Light-emitting diode packages can provide better direct light than fluorescent bulbs or incandescent bulbs. Shade 70A can create an illumination area $A_1$, due to its shape, directly under pendant lamp 160. Shade 70B can create an illumination area $A_2$, due to its shape, directly under pendant lamp 160. As illustrated, the illumination area $A_1$ provides a wider amount of illumination on surface S as compared to the illumination area $A_2$. Thus, different lamp shades can affect the direction and the amount of light that illuminates the surface directly below the pendant lamp. By using a light-emitting diode package as the light-emitting device, the illumination of the area directly below the lamp 160 can be much greater than the amount of illumination provided by an incandescent bulb at the same wattage. For example, an area directly lighted by the light-emitting device through the opening of the shade can be greater than about four times brighter than light from an incandescent bulb using the same wattage. Also, lamp 160 can, for example, provide illumination at least about equally as bright as illumination from a 60 watt incandescent bulb while the light-emitting device uses a power of around (one-sixth) ⅙ that of the incandescent bulb. To help soften the light provided directly under such a luminaire 160 that use light-emitting diode packages as light-emitting devices, a diffuser 170 that comprises a diffusing lens 172 can be positionable directly in front of the light-emitting device 80 as shown in FIG. 9A. Diffuser 170 can comprise a retaining ring 174 to facilitate attachment to luminaire 160, and in particular, the heat sink. Legs 180 can connect diffuser lens 172 to retaining ring 174. As shown in FIG. 9A, retaining ring 174 of diffuser 170 can have threads 176 and can engage a threaded head 168 of heat sink 162. As shown in FIG. 9B, retaining ring 174 can have a lip 178 for attachment to the heat sink. For example, this lip 178 can be placed between detachable platform 150 and the lamp shade or base of the body of the heat sink.

FIGS. 10A-10B illustrate a portion of a lighting package in the form of a different embodiment of a pendant lamp generally designated 230. Pendant lamp 230 and its components provide an easy way to make an electrical connection and to permit the exchange of different platforms 250 and light-emitting devices. As above, the same reference numerals indicate like parts. Pendant lamp 230 can comprise a heat sink 232 that comprises a body 234. Body 234 of heat sink 232 can be similar to the embodiments disclosed above. Body 234 of heat sink 232 can comprise a base 236 against which a lamp shade 70 can reside. Heat sink 232 does not comprise a head section as some other embodiments, but can have a neck 235 that can extend downward from base 236. As above, lamp shade 70 can have walls 72 that extend downward from a top portion 74 positioned against a bottom surface 236A of base 236. As above, walls 72 can be of any aesthetically pleasing shape. Top portion can form an opening through which neck 235 of heat sink 232 can extend. Neck 235 of heat sink 232 can have a thickness that is substantially similar to the thickness of top portion 74 of lamp shade 70.

Heat sink 232 can have a decorative shape that can extend above lamp shade 70. As in the other embodiments, the decorative design can comprises fins 238 that can be spaced apart and extend out from a central core 239. The design of body 234 of heat sink 232 also provides an aesthetically pleasing shape. In this manner, heat sink 232 serves multiple functions that also comprise shade and/or lamp support and strain relief. The shape of body 234 that extends above lamp shade 70 can be any shape that is both aesthetically pleasing and provides adequate heat dissipation for a light-emitting device 80 attached to heat sink 232.

Heat sink 232 illustrated can comprise an opening that comprises an inner wall 232A that defines aperture 232B in at least a portion of the heat sink. In FIGS. 10A-10B, inner wall 232A extends from a top surface 233 of heat sink 232 through the bottom surface 236A of base 236 and neck 235 of heat sink 236. Thereby, inner wall 232A defines aperture 232B so that is extends through heat sink 232. Inner wall 232A can reside in heat sink 232 so that aperture 232B is aligned with a central axis (not shown) that runs through heat sink 232 in a vertical direction. For example, aperture 232B can be centered around the central axis. In this interior aperture 232B, inner wall 232A can form a ledge 232C in aperture 232B. Ledge 232C can be formed along one or more portions of inner wall 232A in aperture 232B. Alternatively, ledge 232C can be formed around the entire inner wall 232A.

An electrical connector 240 can be provided that can reside in aperture 232B. Electrical connector 240 can comprise wiring 242 that terminates at a receiver 244, such as an electrical socket. Receiver 244 can comprise a body that can receive a second electrical connector to provide power to a device connected to the second electrical connector. In embodiments where aperture 232B runs through heat sink 232, wiring 242 can be pull through heat sink 232 from base 236. The body of receiver 244 can be a shape and size that will permit it to contact or engage ledge 232C when wiring 242 is pulled through the passage created by aperture 232B and inner walls 232A. Receiver 244 can rest against ledge 232C. For example, wiring 242 can be pulled taut so that receiver 244 resides against ledge 232C. A strain relief cap 246 can then be secured at top surface 233 of heat sink 232 to hold wiring 242 and receiver 244 of the electrical connector 240 in place. By having the receiver 244 against ledge 232C, the amount of movement of receiver 244 during engagement with a second connector can be diminished or eliminated. Inner walls 232A and the sides of receiver 244 can be dimensioned to prevent lateral movement and the back of receiver 244 residing against ledge 232C can prevent vertical, or longitudinal, movement.

In the embodiment shown in FIGS. 10A-10B and 11A-11B, heat sink 232 can further comprise a platform 250 that can have light-emitting device 80 attached thereto. Platform 250 can be detachable from heat sink 232. Platform 250 can serve as a mechanical coupling that permits light-emitting device 80 to be removably attachable to heat sink 232 by a mechanical coupling. In this embodiment, the attachment of light-emitting device 80 to heat sink 232 by a mechanical coupling also simultaneously electrically connects light-emitting device 80 with an electrical connector such as electrical connector 240 to provide power to light-emitting device 80.

Platform 250 can comprise a substrate 252 that can be any shape that permits attachment of light-emitting device 80 thereto while not undesirably interfering with light emitted from light-emitting device 80. Substrate 252 can have, for example, a planar disc shape. Substrate 252 can form a first surface 252A on which light-emitting device 80 is secured. Substrate 252 can also form a second surface 252B on a side opposite first surface 252A. Platform 250 can comprise an outer edge 252C that can be substantially orthogonal with respect to opposing surfaces 252A, 252B of the platform 250.

Platform 250 can comprise an insert portion of any suitable shape and configuration for attachment in any suitable manner of platform 250 to heat sink 232. For example, insert portion can comprise a guide rod 254 that can extend from second surface 252B. Guide rod 254 of platform 250 can be configured for insertion into aperture 232B to engage inner wall 232A of heat sink 232 at base 236 of heat sink 232. Guide rod 254 can engage the inner wall 232A of heat sink 232 in different manners as will be explained in more detail below. For example, a locking mechanism can be used such as a latch or hook mechanism in either guide rod 254 or inner wall 232A. Alternatively, guide rod 254 and inner wall 232A can form a frictional engagement such as a press fit. In the embodiment illustrated in FIGS. 10A-10B and 11A-11B, inner wall 232A of heat sink 232 and guide rod 254 of the platform 250 can be matchingly threaded, so that guide rod 254 and platform 250 can be screwed into inner wall 232A of heat sink 232. For example, guide rod 254 can have threads 257 on the exterior of guide rod 254 as identified in FIGS. 10B, 11A, and 11B.

A second electrical connector 260 can be associated with platform 250. This second electrical connector 260 can connect light-emitting device 80 to the electrical connector 240 to supply power to light-emitting device 80. Second electrical connector 260 can comprise wiring 262 and an electrical plug 264. In the embodiment shown in FIGS. 10A-10B and 11A-11B, guide rod 254 of platform 250 can comprise electrical plug 264 extending therefrom. Wiring 262 can connect light-emitting device 80 to electrical plug 264. Platform 250 can comprise a recess or groove 256 that can extend along second surface 252B from guide rod 254 to outer edge 252C. Wiring 262, shown in FIGS. 10A-10B and 11A-11B in its insulative outer coating, can extend from a connection with the light-emitting device 80 around outer edge 232C along groove, or recess, 256 and into an aperture 258A formed by walls 258 of guide rod 254 where wiring 262 electrically connects with electrical plug 264. For example, wiring 262 with its insulative outer coating can have a connector 262A on an end for engaging a connector 86 on a substrate 82. Electrical connector 86, when connected to a power supply, can provide power to light-emitting device 80 to disperse light through lens 84.

Wiring 262 with its insulative outer coating can be positioned in groove 256. Groove 256 can have a depth such that wiring 262 with its insulative outer coating can be substantially flush with second surface 252B. In this manner, when platform 250 engages body 234 of heat sink 232, platform 250 can be substantially flush with neck 235 to increase the amount of heat transferred from platform 250 to body 234 of heat sink 232. Groove 256 can lead to an opening 258B at a base of the guide rod 254. Opening 258B can pass through wall 258 and connect with aperture 258A. Wiring 262 with its insulative outer coating can pass through opening 258B into aperture 258A so that wiring 262 can connect with electrical plug 264.

Once the insert portion of platform 250, such as guide rod 254, is inserted into inner wall 232A, electrical plug 264 in guide rod 254 can be aligned coaxially with receiver 244 that resides within inner walls 232A in heat sink 232 against ledge 232C. In the embodiment shown in FIGS. 10A and 10B, as guide rod 254 is screwed into inner wall 232A, the electrical plug 264 enters a socket 244A in receiver 244. Upon attachment, such as by screwing, of guide rod 254 into inner wall 232A of body 234 of heat sink 232, second surface 252B can be generally flush with neck 235 of heat sink 232. At this point, electrical plug 264 fully engages socket 244A in receiver 244 to provide an electrical connection between the first electrical connector 240 and second electrical connector 260 to provide power to light-emitting device 80. The movement of electrical plug 264 upward does not drive receiver 244 upward, because receiver 244 abuts against ledge 232C in aperture 232B of heat sink 232. In this manner, electrical plug 264 of second electrical connector 260 can be configured for electrically contacting socket 244A of receiver 244 of first electrical connector 240 to electrically connect light-emitting device 80 with electrical connector 240.

Figure 11A:
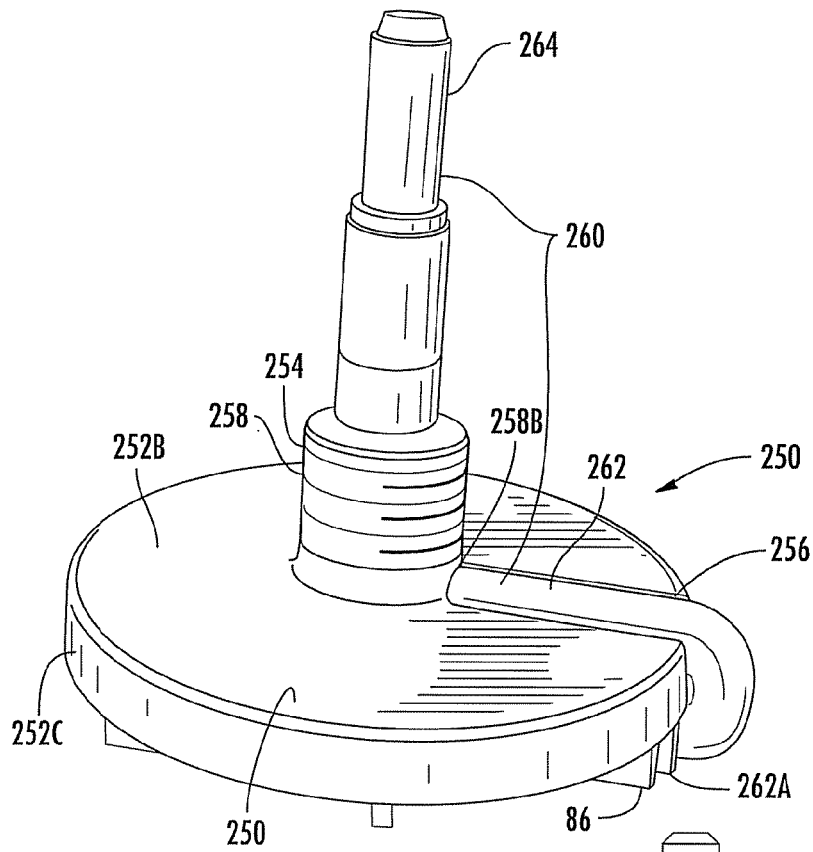
FIG. 11A illustrates a perspective view of the platform and electrical connector that can be used in the luminaire shown in FIG. 10A.
Figure 11B:
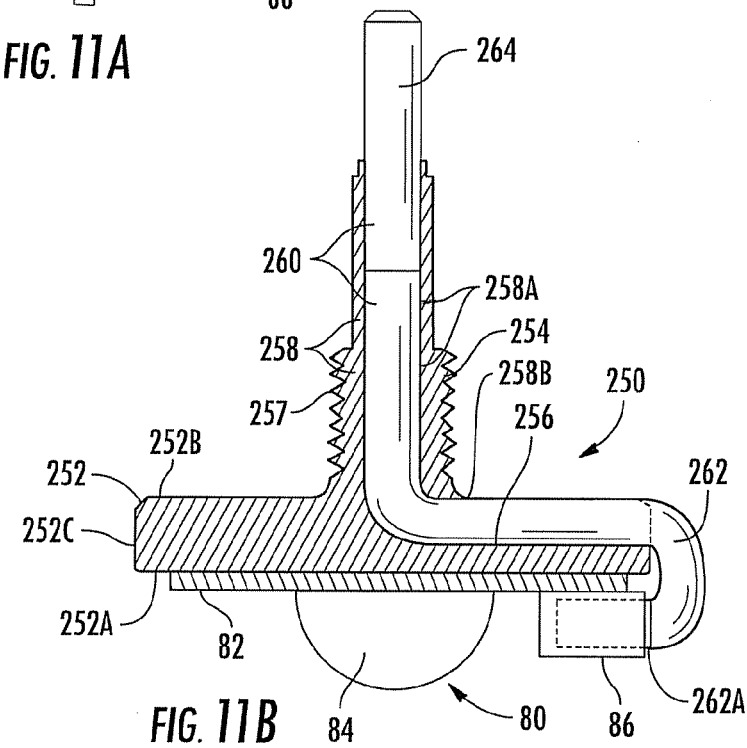
FIG. 11B illustrates a cross-sectional view of the platform and electrical connector shown in FIG. 11A.
Figure 11C:
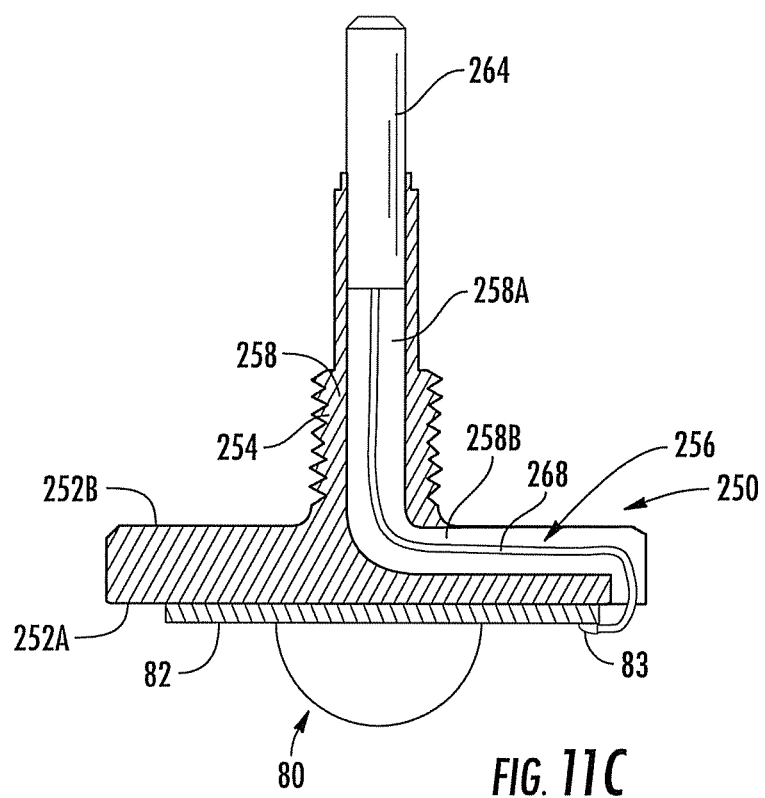
FIG. 11C illustrates a cross-sectional view of an embodiment of a platform and electrical connector according to present subject matter.

FIG. 11C shows another embodiment of a platform 250 in which an electrical connector can be a ribbon 268 that electrically connects light-emitting device 80 positioned on a first surface 252A of platform 250 to electrical plug 264 extending from guide rod 254 of platform 250. Ribbon 268 can extend down from electrical plug 264 and pass through apertures 258A and opening 258B in walls 258. Ribbon 268 can extend along a groove 256 in a second surface 252B of platform 250 until it is positioned to make a top surface electrical connection with a contact 83 on a substrate 82 of light-emitting device 80. In such an embodiment, the profile of the connection between electrical plug 264 and light-emitting device 80 to provide less interference with the light out put from light-emitting device 80. In such an embodiment or in other embodiments, instead of a groove 256, a tunnel through the platform can be used to position the wiring for connection with light-emitting device 80.

It is also envisioned herein that some light-emitting devices 80 can have the cathode and anode pads on the surface of the substrate opposite the lens in some embodiments. In such embodiments, the electrical connectors can be connected to the light-emitting device without exiting the heat sink. In such embodiments, the apertures and openings in the body of heat sink and the platform may need to be modified appropriately.

Neck 235 of heat sink 232 can have a diameter or cross-sectional shape that can fit into opening 76 formed in top portion 74 of lamp shade 70. For example, neck 235 of heat sink 232 can fit snugly into opening 76 formed in top portion 74 of lamp shade 70. Guide rod 254 of platform 250 can have a diameter or cross-sectional shape that allows guide rod 254 to be inserted into neck 235 of heat sink 232 disposed in opening 76 formed in top portion 74 of lamp shade 70. Substrate 252 of platform 250 can have a diameter or cross-sectional area that is wider than opening 76 in top portion 74 of lamp shade 70. In this manner, top portion 74 can abut against bottom surface 236A of base 236 and against second surface 252B of planar substrate 252 of platform 250 so that top portion 74 of lamp shade 70 is sandwiched between base 236 of body 234 and planar substrate 252 of platform 250. In this manner, lamp shade 70 can be held in place in pendant lamp 230.

In pendant lamp 230, heat sink 232 positions light-emitting device 80 at or near top portion 74 of the lamp shade due to the low profile of planar substrate 250 of platform 250. In such an embodiment, the light-emitting device can more fully illuminate lamp shade 70. Heat from light-emitting device 80 can pass through platform 250 into neck 235 and body 234 of heat sink 232 to dissipate heat.

Thus, in the embodiments described above, a lighting package for a light-emitting device can be provided that comprises a heat sink comprising a body. The body of the heat sink can comprise an opening in at least a portion of the heat sink for passage of an electrical connector. The lighting package can also comprise a light-emitting device with the light-emitting device being removably attachable to the heat sink by a mechanical coupling, whereby attaching the light-emitting device to the heat sink also simultaneously electrically connects or couples the light-emitting device with the electrical connector.

Figure 12A:
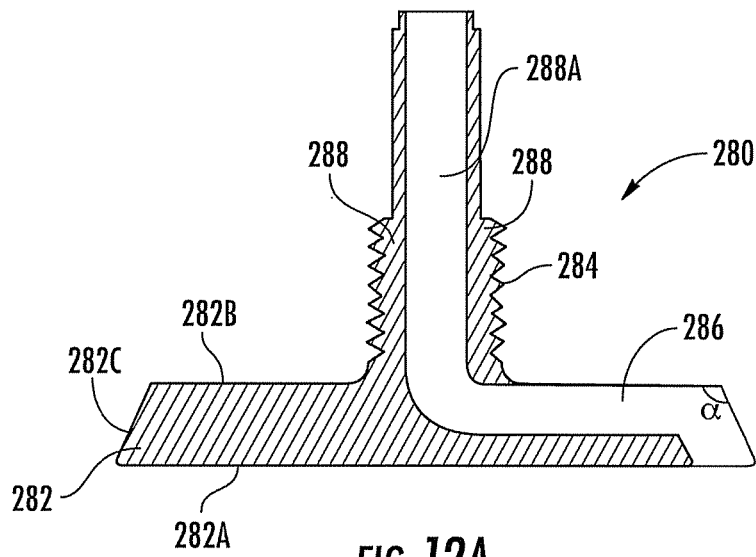
FIG. 12A illustrates a perspective view of another embodiment of a platform and electrical connector according to the present subject matter.
Figure 12B:
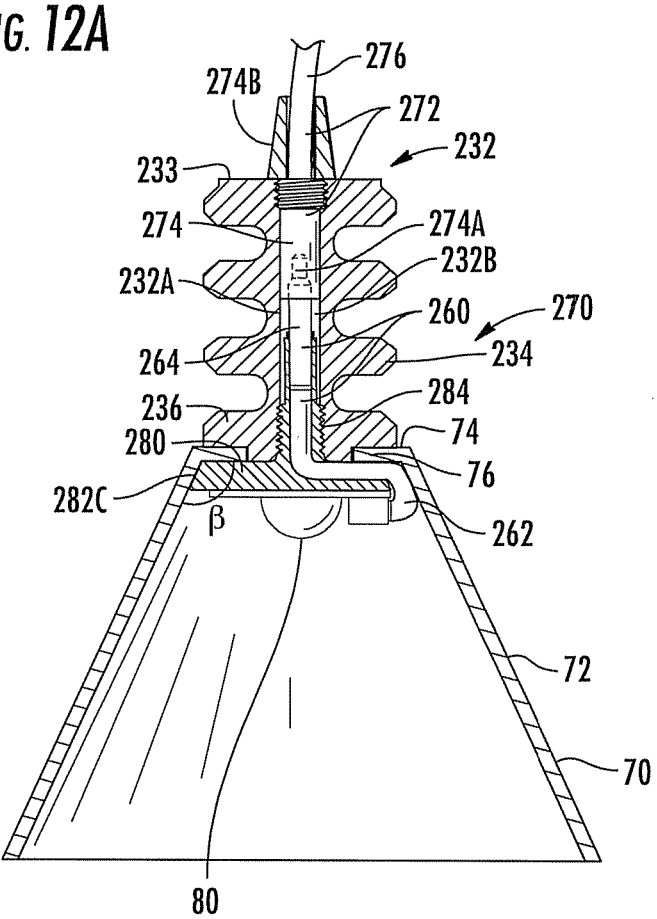
FIG. 12B illustrates a cross-sectional view of a further embodiment of a luminaire with a heat sink using the platform and electrical connector shown in FIG. 12A.

FIGS. 12A and 12B illustrate another embodiment of a luminaire, or lighting package, 270 similar to the lighting package 230 described above. However, lighting package 270 comprises a different first electrical connector 272 and a different platform 280. As shown in FIG. 12A, platform 280 can comprise a substrate 282 that can have, for example, a planar disc shape. Substrate 282 can form a first surface 282A on which light-emitting device 80 can be secured. Substrate 282 can also form a second surface 282B on a side opposite first surface 282A. Substrate 282 of platform 280 can comprise an outer edge 282C that can be generally tapered from smaller second surface 282B to larger first surface 282A. The taper of outer edge 282C at any point can have a same of similar angle α between second surface 282B and outer edge 282C as that of an inner angle β at any point between top portion 74 and wall 72 of shade 70. In this manner, the platform 280 can be dimensioned so that the outer edge 282C can abut against wall 72 of shade 70. Thus, in different embodiments, the shape of the platform can change with the shape of the lamp shade being used.

Platform 280 can comprise a guide rod 284 that can extend from second surface 282B. Guide rod 284 of platform 280 can be configured for insertion into aperture 232B to engage inner wall 232A of heat sink 232 at base 236 of heat sink 232. Platform 280 can comprise a recess or groove 286 that can extend along second surface 282B from guide rod 284 to outer edge 282C. Wiring 262 from second electrical connector 260 can extend from a connection with a light-emitting device on first surface 282A around outer edge 282C along groove 286 and into an aperture 288A formed by walls 288 of guide rod 284 where wiring 262 electrical connects with electrical plug 264 of second electrical connector 260 as shown in FIG. 12B.

In FIG. 12B, first electrical connector 272 comprises a receiver 274 that comprises a socket 274A into which electrical plug 264 can be inserted and electrically connected and wiring 276. Receiver 274 can be threaded that the end distal from the opening of socket 274A. Receiver 274 can be screwed into top surface 233 of body 234 of heat sink 232. Strain relief 274B can be apart of receiver 274 as shown. Alternatively, the receiver can be separately screwed into an appropriate threaded aperture in a heat sink with a separate strain relief being installed after installation of the receiver. The movement of electrical plug 264 upward does not drive receiver 274 upward since receiver 274 is screwed into heat sink 232. In this manner, electrical plug 264 of second electrical connector 260 can be configured for electrically contacting socket 274A of receiver 274 of first electrical connector 272 to electrically connect light-emitting device 80 with electrical connector 272.

Thus, different embodiments of receivers, platforms and plugs can be used in different ways to ensure a proper power supply to the light-emitting device.

Figure 13A:
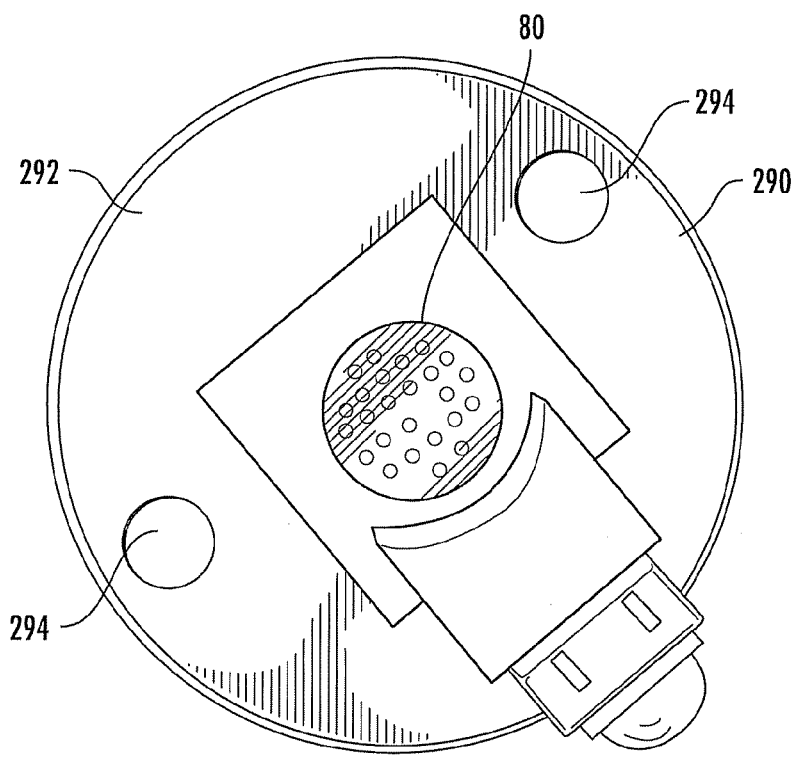
FIGS. 13A and 13B illustrate a bottom plan view of another embodiment of a platform and electrical connector and an embodiment of a tool for removal of the platform from a heat sink according to the present subject matter.
Figure 13B:
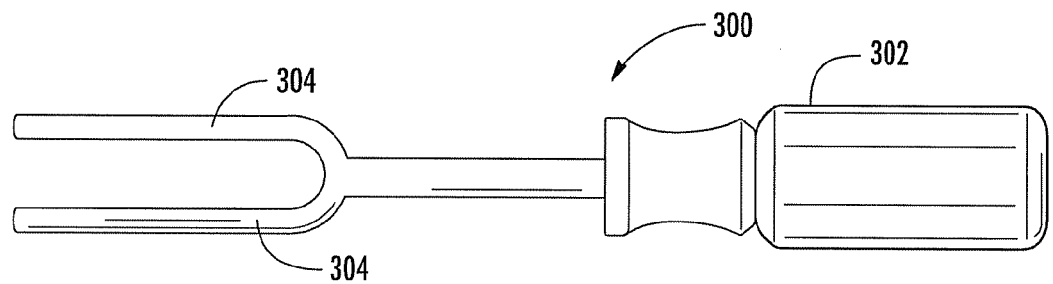

FIG. 13A illustrates an enlarged view of another embodiment of a platform 290 similar to those described above that comprises a light-emitting device 80. Platform 290 can comprise a substrate 292 and mounting grooves, or apertures, 294 therein that can be used to facilitate the attachment and removal of platform 290 to and from a heat sink. FIG. 13B illustrates a tool 300 that comprises a handle 302 and fingers 304 that can engage mounting apertures 294. The tool 300 can then rotate platform 290 in a clockwise or counter-clockwise direction to attach and/or detach, such as by screwing and/or unscrewing, respectively, platform 290 to and from a heat sink. Tool 300 can be especially advantageous if the platform is hot or warm to the touch. Tool 300 can also provide added torque to secure and loosen platform 290 from a heat sink. Fingers 302 can be inserted into mounting apertures 294 and can create a snug fit, so that tool 300 holds platform 290 even when held at an angle. Other embodiments of tools are contemplated, such as pliers, friction wrenches, or the like. The tools can safely remove and install the platforms without touching or interfering with the light-emitting device or the platform.

Figure 14:
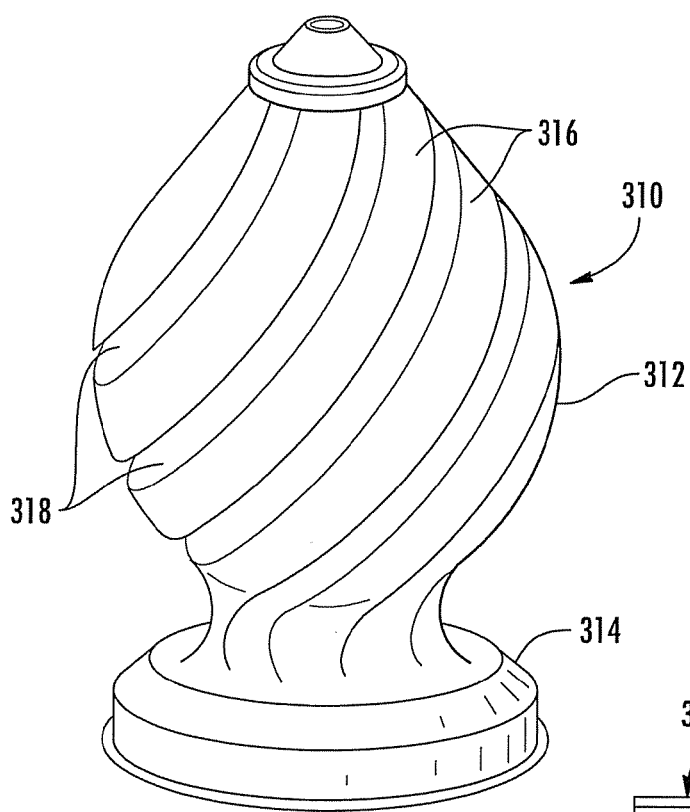
FIG. 14 illustrates a perspective view of another embodiment of a decorative heat sink according to the present subject matter.
Figure 15:
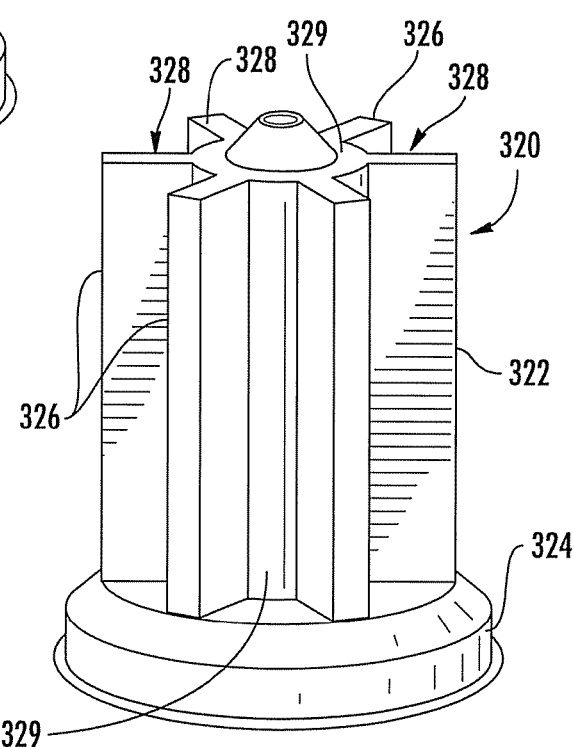
FIG. 15 illustrates a perspective view of further embodiment of a decorative heat sink according to the present subject matter.

FIGS. 14 and 15 illustrate example embodiments of decorative heat sinks that can be used to show that many different stylish features can be employed on the heat sinks according to the present subject matter. FIG. 14 illustrates a heat sink 310 that can comprise a body 312 and a base 314. Heat sink 310 operates and can be constructed in a manner similar to the heat sinks described above. Heat sink 310 has a decorative shape with spiral fins 316 with grooves 318 disposed there between. FIG. 15 illustrates a heat sink 320 that can comprise a body 322 and a base 324. Heat sink 320 can also operate and be constructed in a manner similar to the heat sinks described above. Heat sink 320 has a decorative shape with vertical fins 326 extending radially outward from a center core 329 with grooves, or spacing, 328 disposed between fins 326. Other shapes are contemplated, such as helical shapes, sculptured figures, helical box shapes, random or semi random fin placement, or the like.

Figure 16A:
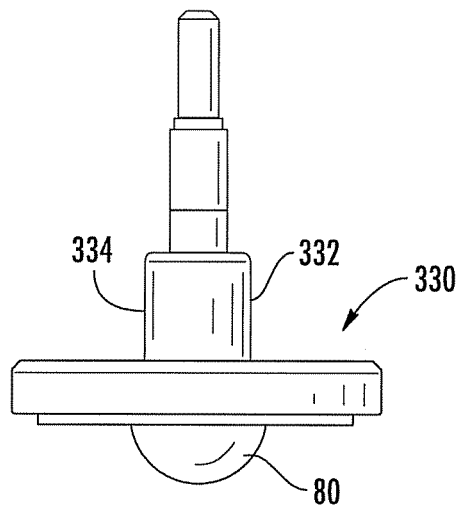
FIGS. 16A-16D illustrate side views of embodiments of different platforms that can engage a decorative sink in different manners according to the present subject matter.

Platforms on which the light-emitting devices reside can engage the heat sink in any suitable manner. For example, the guide rods of some platforms can engage an inner wall of a body of a heat sink in different manners. Some examples of such platforms and guide rods are shown in FIG. 16A-16D. It is understood that the opening and inner wall of the body of the heat sink used with each of the platforms below is modified accordingly to accept and hold the platforms in place. FIGS. 16A-16D illustrates side views of embodiments of different platforms that can engage a decorative sink in different manners. FIG. 16A illustrates a platform 330 with a light-emitting device 80 thereon. Platform 330 can comprise a smooth guide rod 332 with a smooth outer surface 344 to permit the platform to be press fit into an aperture in a heat sink and maintained therein by friction.

Figure 16B:
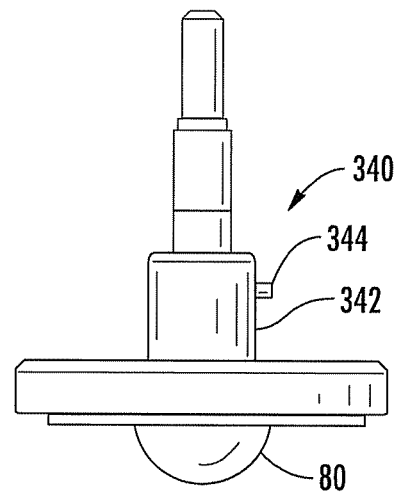

FIG. 16B illustrates a platform 340 with a light-emitting device 80 thereon. Platform 340 can comprise a guide rod 342 that has a pin and barb arrangement 344. Pin and barb 344 can be spring-loaded and can engage an appropriate groove in an inner wall of a heat sink when guide rod 342 is inserted into an aperture formed by the inner wall of the heat sink.

Figure 16C:
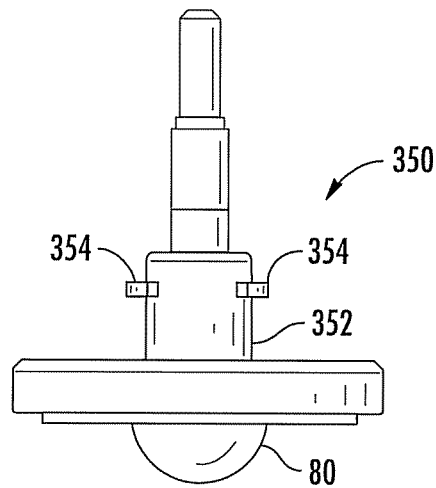

FIG. 16C illustrates a similar platform 350 with a light-emitting device 80 thereon. Platform 350 can comprise a guide rod 352 that can comprise bayonet-type engagement extensions 354 that can be engage quarter-turn grooves in an inner wall of a heat sink when guide rod 352 is inserted into an aperture formed by the inner wall of the heat sink.

Figure 16D:
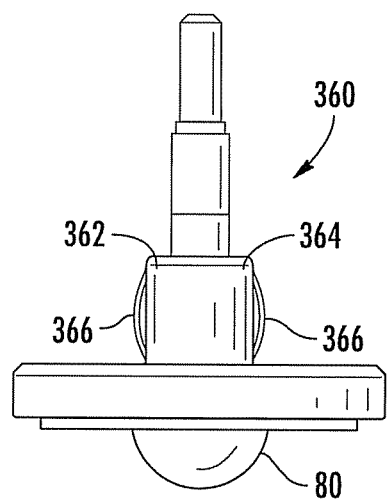

FIG. 16D illustrates a platform 360 with a light-emitting device 80 thereon. Platform 360 can comprise a smooth guide rod 362 that has a smooth outer surface 364 and can comprise one or more leaf spring components 366 that can create a frictional bias against an inner wall of a heat sink when guide rod 362 is inserted into an aperture formed by the inner wall of the heat sink. Smooth outer surface 364 of guide rod 362 and one or more leaf spring components 366 help secure guide rod 362 in the heat sink upon a press fit of guide rod 362 into an aperture in a heat sink.

While such engagement features in FIGS. 16A-16D are shown and described on the guide rods of the platform, it is understood that the engagement features can be on other parts of platform or within the heat sink. As illustrated with aspects of embodiments previously described, the mechanical coupling or attachment of the platform with a heat sink can simultaneously cause an electrical coupling by a separate structure or structures for providing power to the light-emitting device. Additionally, it is envisioned herein that the same structure can be used to both mechanically couple the platform to the heat sink and to simultaneously electrically couple an electrical connector of the light-emitting device to an electrical connector in the heat sink for providing power to the light-emitting device. For example, such a single coupling feature could be on or proximate to the electrical plug to simultaneously provide both an electrical and mechanical engagement. As one non-limiting example, a plug such as a locking banana plug could be utilized where the plug itself provides both the locking mechanical connection as well as an electrical connection.

By using light-emitting devices as shown in and described in reference to FIGS. 3A and 3B with the heat sinks shown and described herein, lighting fixtures and luminaires can be produced that are of higher qualities than those using other lighting systems. The light-emitting devices used in combination with heat sinks as described herein offer the performance, color consistency and lumen density to displace conventional light sources. Such light-emitting devices can do this, while being provided in a small package design. Using such light-emitting devices with these heat sinks can, for example, provide up to at least about 1500 lumens of light at about 250 mA.

The use of such light-emitting devices with these heat sinks can simplify system design and increase color consistency to enable new applications previously achievable only through the use of multiple LED components. Such light-emitting devices in combination with these heat sinks can provide lighting applications where high luminous flux output is required from a single, small area or point source. These combinations can also provide desired lighting capabilities while using a small amount of power. For example, these combinations can provide over about 50 lumens/watt of luminaire efficacy. Thus, by providing a small amount of power, for example, 10 watts total power over about 500 lumens can be the output for a single luminaire depending on the shade used thereon, while providing easy color consistency at the same time. Such light-emitting devices in combination with these heat sinks can also meet ENERGY STAR® SSL Pendant requirements.

As described above, the heat sink disclosed herein can have multiple functions including dissipating the thermal load of the light-emitting device, providing a frame for or directly supporting the pendant shade, and delivering electrical connector support and/or stress relief for the light-emitting device. The heat sink can be machined and/or molded from thermally conductive materials, including metals such as aluminum, to provide a series of large scale circular cooling fins and to have a male-threaded section which can work with a retainer ring, such a plastic flange, to hold a the pendant shade secure. The size of the heat sink can depend on the desired aesthetic qualities, the amount of heat to be dissipated and the support provided.

Any suitable operation parameters can be used. Use of the heat sink disclosed herein in luminaires can, for example, result in the light-emitting device staying below about 100° C. when in extended operation using currents of about 120 mA to about 150 mA. For example, the temperature during operation can remain below about 80° C. when currents of about 120 mA to about 150 mA are used. For instance, the temperature during operation can remain below about 72° C. when currents of about 120 mA to about 150 mA are used. Use of the heat sink can result in minimal modification to an existing luminaire, thus providing the most sophisticated light-emitting devices in luminaire design. Use of the heat sink in the luminaires can, thus, minimize the need for special optics. Use of such a heat sink can also provide a design aesthetic with advantageous heat dissipation. Strain relief, in the form of a compression fitting or equivalent on the top of the heat sink that will help to secure the heat sink and glass to the conductors/suspension cable.

Embodiments of the present disclosure shown in the drawings and described above are exemplary of numerous embodiments that can be made within the scope of the appended claims. It is contemplated that the configurations of lamp assemblies and methods of making the same can comprise numerous configurations other than those specifically disclosed.

What is claimed is:

1. A lighting package for a light-emitting device, the lighting package comprising:
   a heat sink comprising a body, the body of the heat sink comprising an opening in at least a portion of the heat sink for passage of a first electrical connector;
   a platform attachable to the heat sink, wherein the platform comprises a lower surface for abutting the heat sink, wherein the platform comprises an insert portion that is insertable into the opening of the heat sink, wherein the insert portion is configured for mechanically attaching and electrically connecting the platform to the heat sink; and
   a light-emitting device attachable to the platform, wherein attachment of the light-emitting device to the platform electrically connects the light-emitting device with the electrical connector of the heat sink.

2. The lighting package according to claim 1, wherein the heat sink opening comprises an inner wall that defines an aperture for receiving the first electrical connector.

3. The lighting package according to claim 2, wherein the aperture extends from one end of the heat sink to another end of the heat sink.

4. The lighting package according to claim 1, wherein the insert portion is attached to the platform on a first side of the platform and the light-emitting device is attached to a second, opposite side of the platform.

5. The lighting package according to claim 1, wherein the insert portion comprises at least a portion of a second electrical connector, and wherein attachment of the insert portion to the heat sink engages and electrically connects the first and second electrical connectors.

6. The lighting package according to claim 1, wherein the insert portion comprises a guide rod.

7. The lighting package according to claim 6, wherein the opening comprises an inner wall that is matchingly threaded with the guide rod.

8. The lighting package according to claim 6, wherein the guide rod extends from a platform and the light-emitting device is attached to the platform.

9. The lighting package according to claim 8, wherein the platform comprises an outer edge that is substantially orthogonal with respect to opposing surfaces of the platform.

10. The lighting package according to claim 8, wherein the platform comprises an outer edge that tapers from one surface of the platform to another surface of the platform.

11. The lighting package according to claim 8, wherein the platform comprises a recess for passage of at least a portion of a second electrical connector extending from the light-emitting device.

12. The lighting package according to claim 6, wherein the guide rod comprises an electrical plug.

13. The lighting package according to claim 12, wherein the electrical plug is positioned at an end of the guide rod and configured for electrically contacting the first electrical connector to electrically connect the light-emitting device with the first electrical connector.

14. The lighting package according to claim 13, comprising an electrical socket connected with the first electrical connector and the electrical plug configured for being received within the electrical socket to electrically connect the light-emitting device with the first electrical connector.

15. The lighting package according to claim 1, wherein the insert portion comprises a pin and barb arrangement for removably attaching the light-emitting device to the heat sink.

16. The lighting package according to claim 1, wherein the insert portion comprises one or more bayonet-type engagement extensions for removably attaching the light-emitting device to the heat sink.

17. The lighting package according to claim 1, wherein the insert portion comprises a leaf spring for removably attaching the light-emitting device to the heat sink.

18. The lighting package according to claim 1, wherein the light-emitting device is removably attachable to the heat sink by press fitting the insert portion into the opening of the heat sink.

19. The lighting package according to claim 1, wherein an inner wall of the opening comprises a ledge.

20. The lighting package according to claim 1, wherein the ledge is configured for preventing an electrical socket from movement in at least one direction inside the opening.

21. The lighting package according to claim 1, wherein the body of the heat sink comprises spaced apart fins.

22. The lighting package according to claim 21, wherein the fins are circular.

23. The lighting package according to claim 21, wherein the fins are substantially vertical.

24. The lighting package according to claim 1, wherein at least a portion of the body of the heat sink is spiral.

25. The lighting package according to claim 1, further comprising a lamp shade attached to the heat sink.

26. The lighting package according to claim 25, wherein the lamp shade is removably secured to the heat sink with the light-emitting device disposed within the lamp shade and at least a portion of the body of the heat sink forming a decorative top extending outside of the lamp shade.

27. The lighting package according to claim 25, wherein the light-emitting device being attached to an insert portion, and wherein the lamp shade is removably secured to the heat sink by attachment of the insert portion to the heat sink.

28. The lighting package according to claim 1, wherein the light-emitting device is attached to a platform, and further comprising a removal tool for engaging the platform to remove and attach the platform to the heat sink.

29. The lighting package according to claim 28, wherein the removal tool comprises one or more fingers and wherein the platform comprises one or more holes with each hole configured for receiving a finger of the removal tool to remove and attach the platform to the heat sink.

30. A light-emitting device lighting package, comprising:
a heat sink comprising a body and a base, the body of the heat sink comprising an opening extending through the heat sink;
a first electrical connector disposed within the opening of the heat sink;
a light-emitting device positioned on a platform, the platform comprising an insert portion removably attachable to the base of the heat sink, the insert portion comprising a second electrical connector that engages and is electrically connected with the first electrical connector by attachment of the insert portion to the heat sink; and
an area for attachment of a removably attachable structure, wherein the area is disposed between the base of the heat sink and the platform, wherein attachment of the platform to the base of the heat sink can secure the structure.

31. The light-emitting device lighting package according to claim 30, comprising a lamp shade attached to the area with at least a portion of the heat sink extending outside of the lamp shade.

32. The light-emitting device lighting package according to claim 30, comprising a diffuser attached to the area.

33. The light-emitting device lighting package according to claim 32, wherein the diffuser comprises a diffusing lens.

* * * * *